United States Patent
Yamazaki et al.

(10) Patent No.: US 9,389,286 B2
(45) Date of Patent: *Jul. 12, 2016

(54) MAGNETIC SENSOR WITH REDUCED EFFECT OF INTERLAYER COUPLING MAGNETIC FIELD

(71) Applicant: TDK CORPORATION, Tokyo (JP)

(72) Inventors: Hiroshi Yamazaki, Tokyo (JP); Yoshiyuki Mizoguchi, Tokyo (JP); Satoshi Abe, Tokyo (JP); Homare Tokida, Tokyo (JP); Toshiyuki Ayukawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 255 days.

This patent is subject to a terminal disclaimer.

(21) Appl. No.: 14/189,211

(22) Filed: Feb. 25, 2014

(65) Prior Publication Data
US 2014/0292322 A1    Oct. 2, 2014

(30) Foreign Application Priority Data

Mar. 29, 2013    (JP) .................................. 2013-073684
Jan. 17, 2014    (JP) .................................. 2014-006337

(51) Int. Cl.
*G01R 33/09*    (2006.01)

(52) U.S. Cl.
CPC ............ *G01R 33/098* (2013.01); *G01R 33/093* (2013.01)

(58) Field of Classification Search
CPC .... G01R 15/205; G01R 33/09; G01R 33/093; G01R 33/098
USPC ................................................ 324/228, 252
See application file for complete search history.

(56) References Cited

U.S. PATENT DOCUMENTS 5,909,115 A        6/1999   Kano et al.
7,615,996 B1 *    11/2009   Machita ................. B82Y 25/00
                                                               324/252

(Continued)

FOREIGN PATENT DOCUMENTS

JP    2002-270922 A    9/2002
JP    2002-357488 A    12/2002
JP    2005-257434 A    9/2005

(Continued)

OTHER PUBLICATIONS

Mar. 4, 2015 Office Action of Japanese Application No. 2014-006337.

*Primary Examiner* — Reena Aurora
(74) *Attorney, Agent, or Firm* — Oliff PLC

(57) ABSTRACT

A magnetic sensor includes an MR element and a bias field generation unit. The MR element includes a magnetization pinned layer having a magnetization pinned in a direction parallel to an X direction, a free layer having a magnetization that varies depending on an X-direction component of an external magnetic field, and a nonmagnetic layer interposed between the magnetization pinned layer and the free layer. The magnetization pinned layer, the nonmagnetic layer and the free layer are stacked to be adjacent in a Y direction. The free layer receives an interlayer coupling magnetic field in a direction parallel to the X direction resulting from the magnetization pinned layer. The bias field generation unit applies a bias magnetic field to the free layer. The bias magnetic field includes a first component in a direction opposite to that of the interlayer coupling magnetic field and a second component in a Z direction.

12 Claims, 17 Drawing Sheets

(56) References Cited

U.S. PATENT DOCUMENTS

2003/0137381 A1 7/2003 Toyoda et al.
2014/0292321 A1* 10/2014 Yamazaki ............ G01R 33/093
                                                  324/252

FOREIGN PATENT DOCUMENTS

| JP | A-2008-151759 | 7/2008 |
| WO | WO 2008/072610 A1 | 6/2008 |

* cited by examiner

MAGNETIC SENSOR WITH REDUCED EFFECT OF INTERLAYER COUPLING MAGNETIC FIELD

BACKGROUND OF THE INVENTION

1. Field of the Invention

The present invention relates to a magnetic sensor including a magnetoresistive element, and to a magnetic sensor system including the magnetic sensor and a scale.

2. Description of the Related Art

In recent years, magnetic sensor systems have been employed to detect a physical quantity associated with the rotational movement or linear movement of a moving object in a variety of applications. Typically, a magnetic sensor system includes a scale and a magnetic sensor, and the magnetic sensor is configured to generate a signal associated with the relative positional relationship between the scale and the magnetic sensor. Such a magnetic sensor system is disclosed in JP 2008-151759A, WO 2008/072610 A1, US 2003/0137381 A1 and U.S. Pat. No. 5,909,115, for example.

The scale of the magnetic sensor system for use with a rotationally moving object is, in general, a rotating body that moves in response to the movement of the moving object. The rotating body can be, for example, a multipole-magnetized magnet having a plurality of pairs of N and S poles alternately arranged in a circumferential direction, or a gear having teeth formed of a magnetic material. In this case, the magnetic sensor system detects, for example, the rotational position and/or the rotational speed of the rotating body as the physical quantity.

The scale of the magnetic sensor system for use with a linearly moving object is, for example, a linear scale having a plurality of pairs of N and S poles alternately arranged in a linear configuration. In such a case, one of the linear scale and the magnetic sensor moves in response to the movement of the moving object, and the magnetic sensor system detects the relative position and/or speed of the linear scale with respect to the magnetic sensor as the physical quantity.

The magnetic sensor includes a magneto-sensitive element. JP 2008-151759A, WO 2008/072610 A1, and US 2003/0137381 A1 each disclose a magnetic sensor that employs a spin-valve magnetoresistive (MR) element as the magneto-sensitive element. The spin-valve MR element includes a magnetization pinned layer having a fixed magnetization, a free layer having a magnetization whose direction and magnitude vary depending on an external magnetic field, and a nonmagnetic layer interposed between the magnetization pinned layer and the free layer. Examples of spin-valve MR elements include a TMR element in which the nonmagnetic layer is a tunnel barrier layer and a GMR element in which the nonmagnetic layer is a nonmagnetic conductive layer.

In the magnetic sensor employing a spin-valve MR element, the free layer may sometimes receive an interlayer coupling magnetic field resulting from the magnetization pinned layer, as described in JP 2008-151759A. The interlayer coupling magnetic field is in a direction the same as or opposite to the magnetization direction of the magnetization pinned layer. If the free layer receives the interlayer coupling magnetic field, there arises the problem that the amount of a change in the resistance of the MR element with respect to a change in the magnitude of the external magnetic field varies depending on the direction of the external magnetic field, and the problem of a reduced amount of a change in the resistance of the MR element with respect to a change in the magnitude of the external magnetic field.

JP 2008-151759A describes that reducing the interlayer coupling magnetic field to zero makes the output waveform of the magnetic sensor unstable. JP 2008-151759A further teaches a technique for stabilizing the output waveform of the magnetic sensor by applying a bias magnetic field to the free layer in a direction orthogonal to the magnetization direction of the magnetization pinned layer through the use of a permanent magnet. However, when the interlayer coupling magnetic field is not zero, this technique cannot solve the aforementioned problem associated with the interlayer coupling magnetic field.

WO 2008/072610 A1 teaches providing a soft magnetic material element on a side of the MR element so as to apparently improve the magnetic detection sensitivity of the magnetic sensor even in the presence of an interlayer coupling magnetic field being received by the free layer. However, this technique does not directly reduce the effect of the interlayer coupling magnetic field.

US 2003/0137381 A1 and U.S. Pat. No. 5,909,115 each describe a technique for applying a bias magnetic field to the MR element. However, these documents give no consideration to the effect of the interlayer coupling magnetic field.

OBJECT AND SUMMARY OF THE INVENTION

It is an object of the present invention to provide a magnetic sensor and a magnetic sensor system that use a spin-valve magnetoresistive element and are capable of reducing the effect of an interlayer coupling magnetic field that the free layer receives.

A magnetic sensor of a first aspect of the present invention is configured to detect a component in a first direction of an external magnetic field. The magnetic sensor includes a magnetoresistive element and a bias field generation unit. The magnetoresistive element includes a magnetization pinned layer having a magnetization pinned in a direction parallel to the first direction, a free layer having a magnetization that varies depending on the component in the first direction of the external magnetic field, and a nonmagnetic layer interposed between the magnetization pinned layer and the free layer. The magnetization pinned layer, the nonmagnetic layer and the free layer are stacked to be adjacent in a second direction orthogonal to the first direction. The free layer receives an interlayer coupling magnetic field in the direction parallel to the first direction resulting from the magnetization pinned layer. The bias field generation unit applies a bias magnetic field to the free layer. The bias magnetic field includes a first magnetic field component in a direction opposite to the direction of the interlayer coupling magnetic field and a second magnetic field component in a third direction orthogonal to the first and second directions.

In the magnetic sensor of the first aspect of the present invention, the bias field generation unit may include at least one magnet. The at least one magnet may be a pair of magnets arranged with the magnetoresistive element in between. The at least one magnet may be spaced from the magnetoresistive element.

The magnetoresistive element and the at least one magnet may be aligned in a fourth direction inclined with respect to both of the first direction and the third direction. In such a case, the at least one magnet may have a magnetization in a direction parallel to the fourth direction or to the third direction.

A magnetic sensor system of the first aspect of the present invention includes the magnetic sensor of the first aspect of the present invention and a scale whose relative position with respect to the magnetic sensor is variable in the first direction.

The magnetic sensor system is configured so that a change in the relative position of the scale with respect to the magnetic sensor causes a change in the component in the first direction of the external magnetic field.

A magnetic sensor of a second aspect of the present invention is configured to detect a component in a first direction of an external magnetic field. The magnetic sensor includes at least one set of a first magnetoresistive element, a second magnetoresistive element, a first bias field generation unit and a second bias field generation unit. The first magnetoresistive element and the second magnetoresistive element are connected in series.

The first magnetoresistive element includes a first magnetization pinned layer having a magnetization pinned in a direction parallel to the first direction, a first free layer having a magnetization that varies depending on the component in the first direction of the external magnetic field, and a first nonmagnetic layer interposed between the first magnetization pinned layer and the first free layer. The first magnetization pinned layer, the first nonmagnetic layer and the first free layer are stacked to be adjacent in a second direction orthogonal to the first direction. The first free layer receives a first interlayer coupling magnetic field in the direction parallel to the first direction resulting from the first magnetization pinned layer. The first bias field generation unit applies a first bias magnetic field to the first free layer. The first bias magnetic field includes a first magnetic field component in a direction opposite to the direction of the first interlayer coupling magnetic field and a second magnetic field component in a third direction orthogonal to the first and second directions.

The second magnetoresistive element includes a second magnetization pinned layer having a magnetization pinned in a fifth direction opposite to the direction of the magnetization of the first magnetization pinned layer, a second free layer having a magnetization that varies depending on the component in the first direction of the external magnetic field, and a second nonmagnetic layer interposed between the second magnetization pinned layer and the second free layer. The second magnetization pinned layer, the second nonmagnetic layer and the second free layer are stacked to be adjacent in the second direction. The second free layer receives a second interlayer coupling magnetic field resulting from the second magnetization pinned layer, the second interlayer coupling magnetic field being in a direction opposite to the direction of the first interlayer coupling magnetic field. The second bias field generation unit applies a second bias magnetic field to the second free layer. The second bias magnetic field includes a third magnetic field component in a direction opposite to the direction of the second interlayer coupling magnetic field and a fourth magnetic field component in the third direction.

In the magnetic sensor of the second aspect of the present invention, the first bias field generation unit may include at least one first magnet. The first magnetoresistive element and the at least one first magnet may be aligned in a sixth direction inclined with respect to both of the first direction and the third direction. The second bias field generation unit may include at least one second magnet. The second magnetoresistive element and the at least one second magnet may be aligned in a seventh direction inclined with respect to both of the first direction and the third direction. The sixth direction and the seventh direction are inclined in mutually opposite directions with respect to the third direction. The at least one first magnet and the at least one second magnet have magnetizations in the same direction parallel to the third direction.

In the magnetic sensor of the second aspect of the present invention, the at least one set of the first magnetoresistive element, the second magnetoresistive element, the first bias field generation unit and the second bias field generation unit may be two sets of the first magnetoresistive element, the second magnetoresistive element, the first bias field generation unit and the second bias field generation unit. The first and second magnetoresistive elements in the two sets may constitute a Wheatstone bridge circuit.

A magnetic sensor system of the second aspect of the present invention includes the magnetic sensor of the second aspect of the present invention and a scale whose relative position with respect to the magnetic sensor is variable in the first direction. The magnetic sensor system is configured so that a change in the relative position of the scale with respect to the magnetic sensor causes a change in the component in the first direction of the external magnetic field.

In the magnetic sensor and the magnetic sensor system of the first aspect of the present invention, the bias magnetic field applied to the free layer by the bias field generation unit includes the first magnetic field component in the direction opposite to the direction of the interlayer coupling magnetic field and the second magnetic field component in the third direction orthogonal to the first and second directions. The first magnetic field component acts to cancel out the interlayer coupling magnetic field. The second magnetic field component acts to stabilize the magnetization direction of the free layer when the external magnetic field has a zero component in the first direction. Consequently, the first aspect of the present invention makes it possible to reduce the effect of the interlayer coupling magnetic field that the free layer receives in the magnetic sensor and the magnetic sensor system employing the spin-valve magnetoresistive element.

In the magnetic sensor and the magnetic sensor system of the second aspect of the present invention, the first bias magnetic field applied to the first free layer by the first bias field generation unit includes the first magnetic field component in the direction opposite to the direction of the first interlayer coupling magnetic field and the second magnetic field component in the third direction orthogonal to the first and second directions. The first magnetic field component acts to cancel out the first interlayer coupling magnetic field. The second magnetic field component acts to stabilize the magnetization direction of the first free layer when the external magnetic field has a zero component in the first direction. Further, the second bias magnetic field applied to the second free layer by the second bias field generation unit includes the third magnetic field component in the direction opposite to the direction of the second interlayer coupling magnetic field and the fourth magnetic field component in the third direction. The third magnetic field component acts to cancel out the second interlayer coupling magnetic field. The fourth magnetic field component acts to stabilize the magnetization direction of the second free layer when the external magnetic field has a zero component in the first direction. Consequently, the second aspect of the present invention makes it possible to reduce the effects of the first interlayer coupling magnetic field that the first free layer receives and the second interlayer coupling magnetic field that the second free layer receives in the magnetic sensor and the magnetic sensor system employing the first and second spin-valve magnetoresistive elements.

Other and further objects, features and advantages of the present invention will appear more fully from the following description.

DETAILED DESCRIPTION OF THE PREFERRED EMBODIMENTS

First Embodiment

Figure 1:
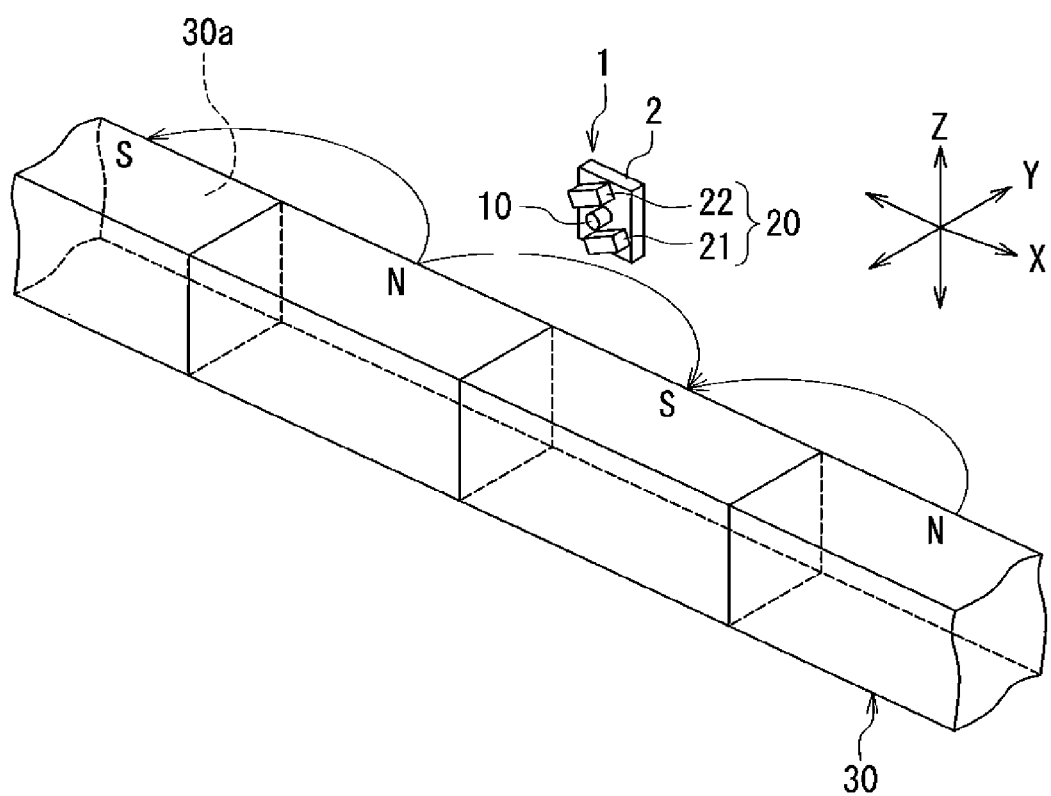
FIG. 1 is a perspective view illustrating the general configuration of a magnetic sensor system according to a first embodiment of the invention.

Preferred embodiments of the present invention will now be described in detail with reference to the drawings. First, reference is made to FIG. 1 to describe the general configuration of a magnetic sensor system according to a first embodiment of the invention. FIG. 1 is a perspective view illustrating the general configuration of the magnetic sensor system according to the first embodiment. As shown in FIG. 1, the magnetic sensor system according to the first embodiment includes a magnetic sensor 1 according to the first embodiment and a scale 30 whose relative position with respect to the magnetic sensor 1 is variable in a first direction. The first direction will hereinafter be referred to as the X direction. In the first embodiment, the scale 30 is particularly a linear scale having a plurality of pairs of N and S poles alternately arranged in a linear configuration along the X direction. The scale 30 has a side surface 30a parallel to the X direction. The magnetic sensor 1 is disposed to face the side surface 30a. One of the magnetic sensor 1 and the scale 30 moves in the X direction in response to the movement of a moving object (not illustrated). This causes a change in the relative position of the scale 30 with respect to the magnetic sensor 1 in the X direction. In FIG. 1 the curved arrows indicate a magnetic flux produced by the scale 30. The magnetic sensor 1 is configured to detect a component in the X direction of an external magnetic field. Hereinafter, "component in the X direction" will be expressed as "X-direction component", and the X-direction component of the external magnetic field will be denoted by symbol Hx. The external magnetic field is produced by the scale 30. A change in the relative position of the scale 30 with respect to the magnetic sensor 1 causes a change in the X-direction component Hx of the external magnetic field.

Figure 2:
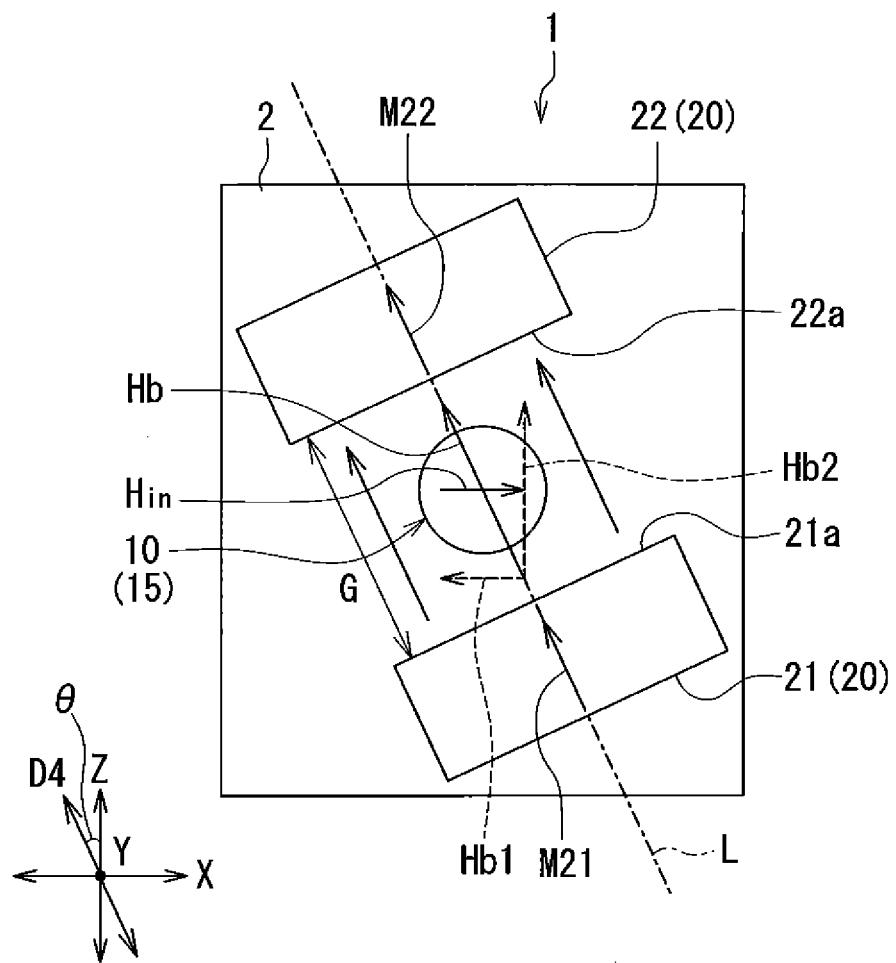
FIG. 2 is a plan view of a magnetic sensor according to the first embodiment of the invention.

The magnetic sensor 1 will now be described with reference to FIG. 1 and FIG. 2. FIG. 2 is a plan view of the magnetic sensor 1. The magnetic sensor 1 includes a substrate 2, a spin-valve magnetoresistive (MR) element 10 disposed on the substrate 2, and a bias field generation unit 20. The MR element 10 may be a TMR element or a GMR element. The bias field generation unit 20 includes at least one magnet. The at least one magnet may be spaced from the MR element 10. The at least one magnet of the first embodiment is particularly a pair of magnets 21 and 22 arranged with the MR element 10 in between. The magnets 21 and 22 are placed on the substrate 2 and are each spaced from the MR element 10. Each of the magnets 21 and 22 has a rectangular solid shape, for example. FIG. 1 and FIG. 2 show an example in which the MR element 10 has a cylindrical shape. However, the MR element 10 may have any other shape, such as a rectangular solid shape.

Figure 3:
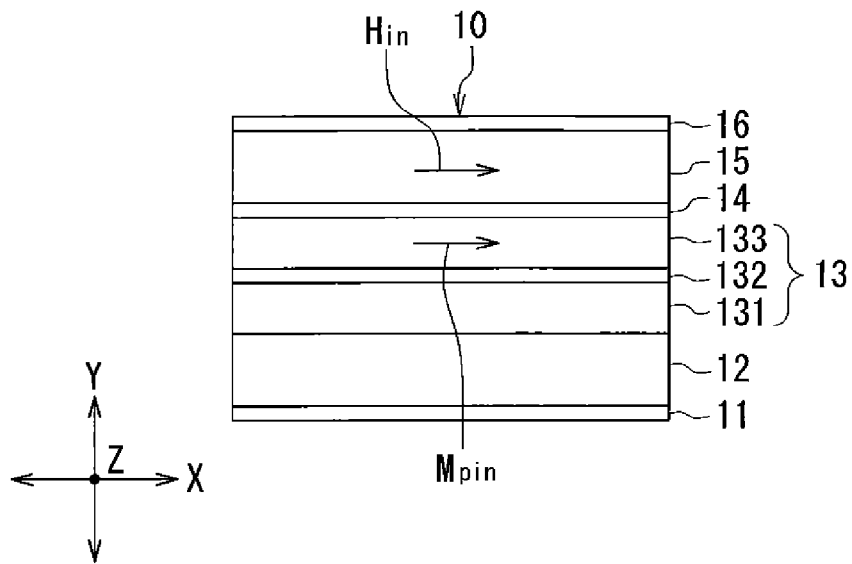
FIG. 3 is a side view illustrating an example of the configuration of the MR element shown in FIG. 2.

The MR element 10 will now be described with reference to FIG. 3. FIG. 3 is a side view illustrating an example of the configuration of the MR element 10. The MR element 10 includes at least a magnetization pinned layer 13 having a magnetization pinned in a direction parallel to the X direction, a free layer 15 having a magnetization that varies depending on the X-direction component Hx of the external magnetic field, and a nonmagnetic layer 14 interposed between the magnetization pinned layer 13 and the free layer 15.

In the example shown in FIG. 3, the MR element 10 further includes an underlayer 11, an antiferromagnetic layer 12 and a protective layer 16. In this example, the underlayer 11, the antiferromagnetic layer 12, the magnetization pinned layer 13, the nonmagnetic layer 14, the free layer 15, and the protective layer 16 are stacked in this order on the substrate 2. The underlayer 11 and the protective layer 16 are conductive. The underlayer 11 is provided for eliminating the effects of the crystal axis of the substrate 2 and to improve the crystallinity and orientability of each layer formed on the underlayer 11. The underlayer 11 may be formed of Ta or Ru, for example. The antiferromagnetic layer 12 is to pin the magnetization direction of the magnetization pinned layer 13 by means of exchange coupling with the magnetization pinned layer 13. The antiferromagnetic layer 12 is formed of an antiferromagnetic material such as IrMn or PtMn.

The magnetization direction of the magnetization pinned layer 13 is pinned by exchange coupling between the antiferromagnetic layer 12 and the magnetization pinned layer 13 at the interface therebetween. In the example shown in FIG. 3, the magnetization pinned layer 13 includes an outer layer 131, a nonmagnetic intermediate layer 132 and an inner layer 133 stacked in this order on the antiferromagnetic layer 12, and is thus formed as a so-called synthetic pinned layer. The outer layer 131 and the inner layer 133 are each formed of a soft magnetic material such as CoFe, CoFeB or CoNiFe. The magnetization direction of the outer layer 131 is pinned by exchange coupling between the outer layer 131 and the antiferromagnetic layer 12. The outer layer 131 and the inner layer 133 are antiferromagnetically coupled to each other, and their magnetizations are thus pinned in mutually opposite directions. The nonmagnetic intermediate layer 132 induces antiferromagnetic exchange coupling between the outer layer 131 and the inner layer 133 so as to pin the magnetizations of the outer layer 131 and the inner layer 133 in mutually opposite directions. The nonmagnetic intermediate layer 132 is formed of a nonmagnetic material such as Ru. When the magnetization pinned layer 13 includes the outer layer 131, the nonmagnetic intermediate layer 132 and the inner layer 133, the magnetization direction of the magnetization pinned layer 13 refers to that of the inner layer 133. In FIG. 3, the arrow labeled Mpin represents the magnetization of the magnetization pinned layer 13. The direction indicated by this arrow is the magnetization direction of the magnetization pinned layer 13.

If the MR element 10 is a TMR element, the nonmagnetic layer 14 is a tunnel barrier layer. The tunnel barrier layer may be formed by oxidizing a part or the whole of a magnesium layer. If the MR element 10 is a GMR element, the nonmagnetic layer 14 is a nonmagnetic conductive layer. The free layer 15 is formed of, for example, a soft magnetic material such as CoFe, CoFeB, NiFe, or CoNiFe. The protective layer 16 is provided for protecting the layers located thereunder. The protective layer 16 may be formed of Ta, Ru, W, or Ti, for example.

The magnetization pinned layer 13, the nonmagnetic layer 14 and the free layer 15 are stacked to be adjacent in a second direction orthogonal to the X direction. The second direction will hereinafter be referred to as the Y direction. In the first embodiment, the Y direction is perpendicular to the side surface 30a of the scale 30.

In the MR element 10, the magnetization of the free layer 15 varies depending on the magnetic field applied to the free layer 15. More specifically, the direction and magnitude of the magnetization of the free layer 15 vary depending on the direction and magnitude of the magnetic field applied to the free layer 15. The MR element 10 varies in resistance depending on the direction and magnitude of the magnetization of the free layer 15. For example, if the free layer 15 has a magnetization of a constant magnitude, the MR element 10 has a minimum resistance when the magnetization of the free layer 15 is in the same direction as that of the magnetization pinned layer 13, and has a maximum resistance when the magnetization of the free layer 15 is in the opposite direction to that of the magnetization pinned layer 13.

If the MR element 10 is a GMR element, the MR element 10 may be of either the current-perpendicular-to-plane (CPP) type in which a current is fed in a direction intersecting the plane of the layers constituting the MR element 10, such as a direction perpendicular to the plane of the layers constituting the MR element 10, or the current-in-plane (CIP) type in which a current is fed in a direction generally parallel to the plane of the layers constituting the MR element 10. If the MR element 10 is a TMR element, it is of the CPP type.

If the MR element 10 is of the CPP type, for example, the underlayer 11 and the protective layer 16 are connected with electrodes (not illustrated) through which the MR element 10 is supplied with a current intended to allow the magnetic sensor 1 to generate a signal associated with the resistance of the MR element 10. The current flows in a direction intersecting the plane of the layers constituting the MR element 10, such as the direction perpendicular to the plane of the layers constituting the MR element 10. For example, if a current of a constant value is supplied to the MR element 10, the signal associated with the resistance of the MR element 10 can be generated by using the potential difference across the MR element 10. If the MR element 10 is of the CIP type, for example, two electrodes (not illustrated) are connected to two locations on the protective layer 16 apart from each other, so that a current for the above-mentioned purpose is supplied to the MR element 10 through these electrodes. The current flows in a direction generally parallel to the plane of the layers constituting the MR element 10. In this case also, the signal associated with the resistance of the MR element 10 can be generated in the same manner as above.

In the first embodiment, magnetic interlayer coupling takes place between the free layer 15 and the magnetization pinned layer 13 via the nonmagnetic layer 14. This causes the free layer 15 to receive an interlayer coupling magnetic field Hin in a direction parallel to the X direction resulting from the magnetization pinned layer 13. The direction of the interlayer coupling magnetic field Hin is the same as or opposite to the magnetization direction of the magnetization pinned layer 13. In FIG. 3, the arrow labeled Hin represents the interlayer coupling magnetic field Hin. The direction indicated by this arrow is the direction of the interlayer coupling magnetic field Hin. FIG. 3 illustrates an example in which the interlayer coupling magnetic field Hin is in the same direction as the magnetization Mpin of the magnetization pinned layer 13.

As shown in FIG. 2, the bias field generation unit 20 or a pair of magnets 21, 22 applies a bias magnetic field Hb to the free layer 15. The bias magnetic field Hb includes a first magnetic field component Hb1 in a direction opposite to the direction of the interlayer coupling magnetic field Hin and a second magnetic field component Hb2 in a third direction orthogonal to the X and Y directions. The third direction will hereinafter be referred to as the Z direction.

As used herein, each of the X, Y and Z directions is defined as including one particular direction and a direction opposite thereto, as indicated by the respective double-headed arrows in FIG. 1. On the other hand, the direction of any magnetic field or magnetization is defined as indicating a single particular direction.

The MR element 10 and the pair of magnets 21 and 22 are aligned in a fourth direction D4 inclined with respect to both of the X direction and the Z direction. More specifically, when viewed in the Y direction, the centers of the MR element 10 and the magnets 21 and 22 are collinear along a straight line L extending in the fourth direction D4, as shown in FIG. 2.

In the first embodiment, the magnets 21 and 22 have magnetizations in the same direction parallel to the fourth direction D4. As with the X, Y and Z directions, the fourth direction D4 is also defined as including one particular direction and a direction opposite thereto. In FIG. 2, the arrow labeled M21 represents the magnetization of the magnet 21. The direction indicated by this arrow is the direction of the magnetization of the magnet 21. Further, in FIG. 2 the arrow labeled M22 represents the magnetization of the magnet 22. The direction indicated by this arrow is the direction of the magnetization of the magnet 22.

The magnet 21 has an end face 21a facing the MR element 10. The magnet 22 has an end face 22a facing the MR element 10. The end faces 21a and 22a are perpendicular to the fourth direction D4. In the example shown in FIG. 2, the N pole of the magnet 21 appears at the end face 21a while the S pole of the magnet 22 appears at the end face 22a. In the first embodiment, the bias magnetic field Hb is in a direction parallel to the fourth direction D4.

The distance between the magnets 21 and 22 or the distance between the end faces 21a and 22a is denoted by symbol G. The angle that the fourth direction D4 forms with respect to the Z direction is defined as the inclination angle of the magnets 21 and 22 and denoted by symbol θ. The first magnetic field component Hb1 and the second magnetic field component Hb2 can be adjusted by the distance G and the inclination angle θ. This will be described in detail later.

The function and effects of the magnetic sensor 1 and the magnetic sensor system according to the first embodiment will now be described. In the magnetic sensor system according to the first embodiment, the scale 30 produces an external magnetic field to be detected by the magnetic sensor 1. A change in the relative position of the scale 30 with respect to the magnetic sensor 1 causes a change in the X-direction component Hx of the external magnetic field. More specifically, as the relative position of the scale 30 with respect to the magnetic sensor 1 changes, the external magnetic field changes direction such that the direction of the external magnetic field rotates about the Z-direction axis when viewed from the magnetic sensor 1. As a result, the X-direction component Hx of the external magnetic field changes. The X-direction component Hx is sometimes oriented in the same direction as the magnetization Mpin of the magnetization pinned layer 13 and sometimes oriented in the opposite direction to the magnetization Mpin. Hereinafter, the magnitude of the X-direction component Hx when the X-direction component Hx is oriented in the opposite direction to the magnetization Mpin will be expressed in positive values, and the magnitude of the X-direction component Hx when the X-direction component Hx is oriented in the same direction as the magnetization Mpin will be expressed in negative values.

The magnetic sensor 1 includes the spin-valve MR element 10. The MR element 10 varies in resistance depending on the X-direction component Hx of the external magnetic field. The magnetic sensor 1 generates a signal associated with the resistance of the MR element 10. This signal allows for detection of a physical quantity associated with the linear movement of the moving object, such as the relative position and/or speed of the scale 30 with respect to the magnetic sensor 1.

In the MR element 10, the free layer 15 receives the interlayer coupling magnetic field Hin in the direction parallel to the X direction resulting from the magnetization pinned layer 13. Here, consider a case where the bias field generation unit 20 of the first embodiment is not provided. In such a case, there arises the problem that the amount of a change in the resistance of the MR element 10 with respect to a change in the magnitude of the X-direction component Hx of the external magnetic field varies depending on the direction of the X-direction component Hx, and the problem of a reduced amount of a change in the resistance of the MR element 10 with respect to a change in the magnitude of the X-direction component Hx, which results in a reduced sensitivity of the MR element 10. This will be described in detail below with reference to FIG. 4.

Figure 4:
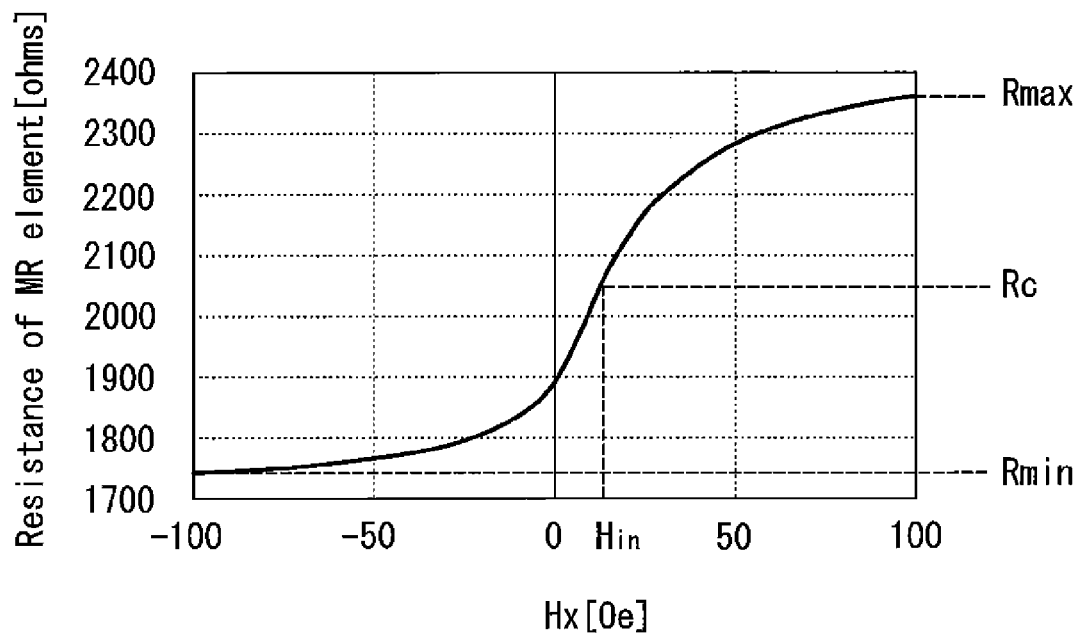
FIG. 4 is a characteristic diagram illustrating an example of the relationship between a component in an X direction of an external magnetic field and the resistance of the MR element.

FIG. 4 is a characteristic diagram illustrating an example of the relationship between the X-direction component Hx of the external magnetic field and the resistance of the MR element 10. In FIG. 4, the horizontal axis represents the X-direction component Hx of the external magnetic field, and the vertical axis represents the resistance of the MR element 10. The horizontal axis is expressed in oersteds (Oe) (1 Oe=79.6 A/m) and the vertical axis is expressed in ohms. As shown in FIG. 4, the maximum resistance of the MR element 10 is represented by Rmax, the minimum resistance of the MR element 10 is represented by Rmin, and the median value between Rmax and Rmin, i.e., (Rmax+Rmin)/2, is represented by Rc. Assume here that the MR element 10 has a resistance of Rc when the X-direction component Hx is zero. In such a case, the amount of a change in the resistance of the MR element 10 with respect to a change in the magnitude of the X-direction component Hx does not vary depending on the direction of the X-direction component Hx and, when the X-direction component Hx is around zero, a large amount of a change in the resistance of the MR element 10 with respect to a change in the magnitude of the X-direction component Hx is obtained to make the MR element 10 high in sensitivity. However, if the free layer 15 receives the interlayer coupling magnetic field Hin, the value of the X-direction component Hx at which the MR element 10 has a resistance of Rc differs from zero by the magnitude of the interlayer coupling magnetic field Hin. As a result, the amount of a change in the resistance of the MR element 10 with respect to a change in the magnitude of the X-direction component Hx varies depending on the direction of the X-direction component Hx and, when the X-direction component Hx is around zero, the amount of a change in the resistance of the MR element 10 with respect to a change in the magnitude of the X-direction component Hx is reduced to cause the MR element 10 to be low in sensitivity.

In the first embodiment, the direction and magnitude of the interlayer coupling magnetic field Hin being received by the free layer 15 can be determined by determining, with the bias field generation unit 20 eliminated, the relationship between the X-direction component Hx and the resistance of the MR element 10 as shown in FIG. 4 and further determining the value of the X-direction component Hx at which the MR element 10 has a resistance of Rc.

As shown in FIG. 2, the magnetic sensor 1 according to the first embodiment includes the bias field generation unit 20 to apply the bias magnetic field Hb to the free layer 15. The bias magnetic field Hb includes the first magnetic field component Hb1 in the opposite direction to the interlayer coupling magnetic field Hin and the second magnetic field component Hb2 in the Z direction. The first magnetic field component Hb1 acts to cancel out the interlayer coupling magnetic field Hin.

Figure 5:
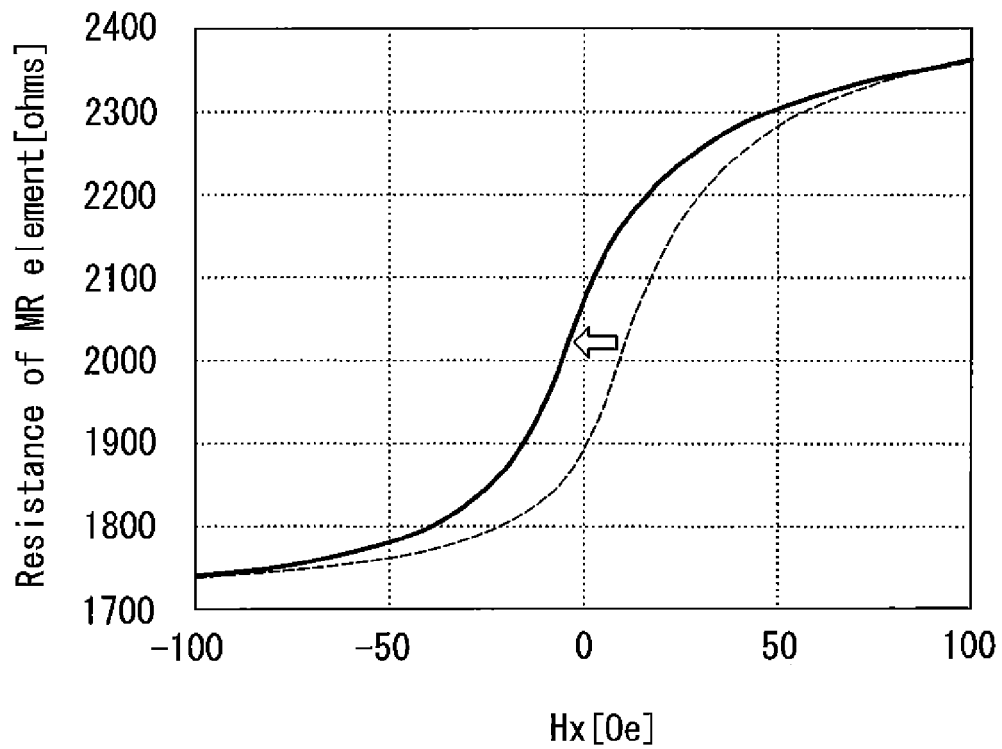
FIG. 5 is a characteristic diagram illustrating the effect of a first magnetic field component of a bias magnetic field.

Now, the results of an experiment will be shown which was conducted to examine the aforementioned action of the first magnetic field component Hb1. In the experiment, the relationship between the X-direction component Hx of the external magnetic field and the resistance of the MR element 10 was determined both in the presence and absence of the bias field generation unit 20 (the magnets 21 and 22). FIG. 5 shows the results. The horizontal axis and the vertical axis of FIG. 5 are the same as those of FIG. 4. In FIG. 5, the broken line indicates the relationship between the X-direction component Hx and the resistance of the MR element 10 in the absence of the bias field generation unit 20, while the solid line indicates the relationship between the X-direction component Hx and the resistance of the MR element 10 in the presence of the bias field generation unit 20. As shown in FIG. 5, when in the presence of the bias field generation unit 20, the amount of a change in the resistance of the MR element 10 with respect to a change in the magnitude of the X-direction component Hx is almost the same between the positive-value region for the X-direction component Hx and the negative-value region for the X-direction component Hx. Further, when the X-direction component Hx is around zero, a larger amount of a change in the resistance of the MR element 10 with respect to a change in the magnitude of the X-direction component Hx and thus a higher sensitivity of the MR element 10 are achieved in the presence of the bias field generation unit 20 than in the absence of the bias field generation unit 20.

The second magnetic field component Hb2 of the bias magnetic field Hb acts to stabilize the magnetization direction of the free layer 15 when the X-direction component Hx of the external magnetic field is zero. It is thereby possible to prevent the output signal waveform of the magnetic sensor 1 from becoming unstable due to the cancellation of the interlayer coupling magnetic field Hin by the first magnetic field component Hb1.

Consequently, the first embodiment makes it possible to reduce the effect of the interlayer coupling magnetic field Hin that the free layer 15 receives in the magnetic sensor 1 and the magnetic sensor system employing the spin-valve MR element 10.

The first magnetic field component Hb1 and the second magnetic field component Hb2 can be adjusted by the distance G between the magnets 21 and 22 and the inclination angle θ of the magnets 21 and 22 shown in FIG. 2. This will be described in detail below with reference to FIG. 6 and FIG. 7.

Figure 6:
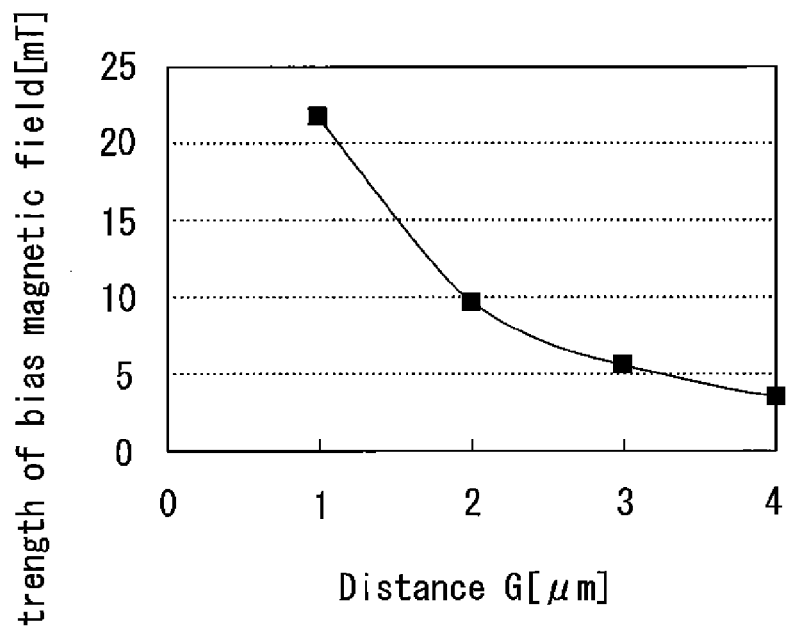
FIG. 6 is a characteristic diagram illustrating the relationship between the distance between a pair of magnets shown in FIG. 2 and the strength of the bias magnetic field.

FIG. 6 is a characteristic diagram illustrating the relationship between the distance G between the magnets 21 and 22 and the strength of the bias magnetic field Hb, which was determined by a first simulation. The first simulation assumed that the magnets 21 and 22 each had a surface flux density of 1.04 T. In FIG. 6, the horizontal axis represents the distance G, and the vertical axis represents the strength of the bias magnetic field Hb. The horizontal axis is expressed in micrometers (μm). The vertical axis is expressed in milli-Tesla (mT), which is a unit expressing the magnitude of flux density. The strength of the bias magnetic field Hb is expressed in the value at the center of the free layer 15 when viewed in the Y direction. FIG. 6 shows that the strength of the bias magnetic field Hb decreases with increasing distance G.

Figure 7:
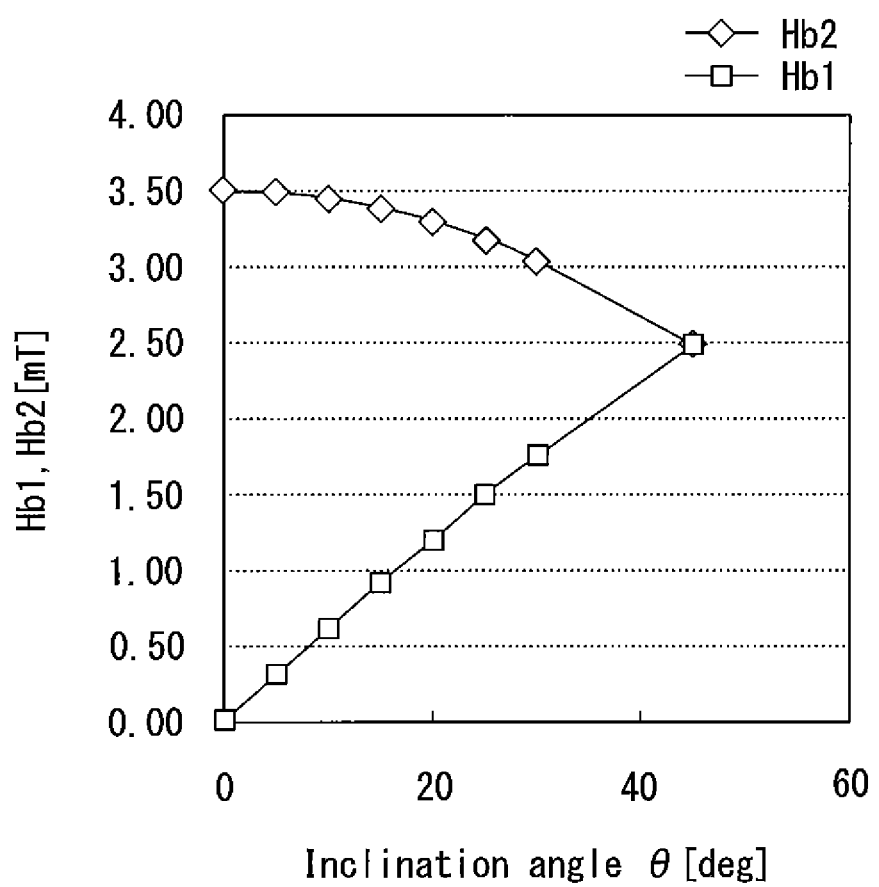
FIG. 7 is a characteristic diagram illustrating the relationship between the inclination angle of the magnets shown in FIG. 2 and the first and second magnetic field components of the bias magnetic field.

FIG. 7 is a characteristic diagram illustrating the relationship between the inclination angle θ of the magnets 21 and 22 and the magnetic field components Hb1 and Hb2, which was determined by a second simulation. In FIG. 7, the horizontal axis represents the inclination angle θ, and the vertical axis represents the strength of the magnetic field components Hb1 and Hb2. The horizontal axis is expressed in degrees. The vertical axis is expressed in mT. The second simulation assumed that the magnets 21 and 22 each had a surface flux density of 1.04 T, and the distance G between the magnets 21 and 22 was 4 μm. FIG. 7 shows that with the inclination angle θ within the range of 0 to 45 degrees, the strength of the magnetic field component Hb1 increases and the strength of the magnetic field component Hb2 decreases with increasing inclination angle θ. It can thus be seen from FIG. 7 that the ratio between the strengths of the magnetic field components Hb1 and Hb2 can be adjusted by the inclination angle θ. Further, it is clear from the results shown in FIG. 6 that changing the distance G with the inclination angle θ kept constant can change the strengths of the magnetic field components Hb1 and Hb2 with the ratio between the strengths thereof kept constant.

The results shown in FIG. 6 and FIG. 7 indicate that the magnetic field components Hb1 and Hb2 can be adjusted by the distance G and the inclination angle θ. It is clear that changing the surface flux densities of the magnets Hb1 and Hb2 will change the strengths of the bias magnetic field Hb and the magnetic field components Hb1 and Hb2, but will not change the tendencies shown in FIG. 6 and FIG. 7. The surface flux densities of the magnets 21 and 22 can be adjusted by the design of the magnets 21 and 22, such as the material, shape and size of the magnets 21 and 22. Thus, the magnetic field components Hb1 and Hb2 can be adjusted also by the design of the magnets 21 and 22 as well as the distance G and the inclination angle θ. It is therefore possible according to the first embodiment to adjust the magnitude of the magnetic field component Hb1 to a value that can cancel out the interlayer coupling magnetic field Hin and to adjust the magnitude of the magnetic field component Hb2 to any value suitable to stabilize the magnetization direction of the free layer 15 when the X-direction component Hx is zero.

Second Embodiment

Figure 8:
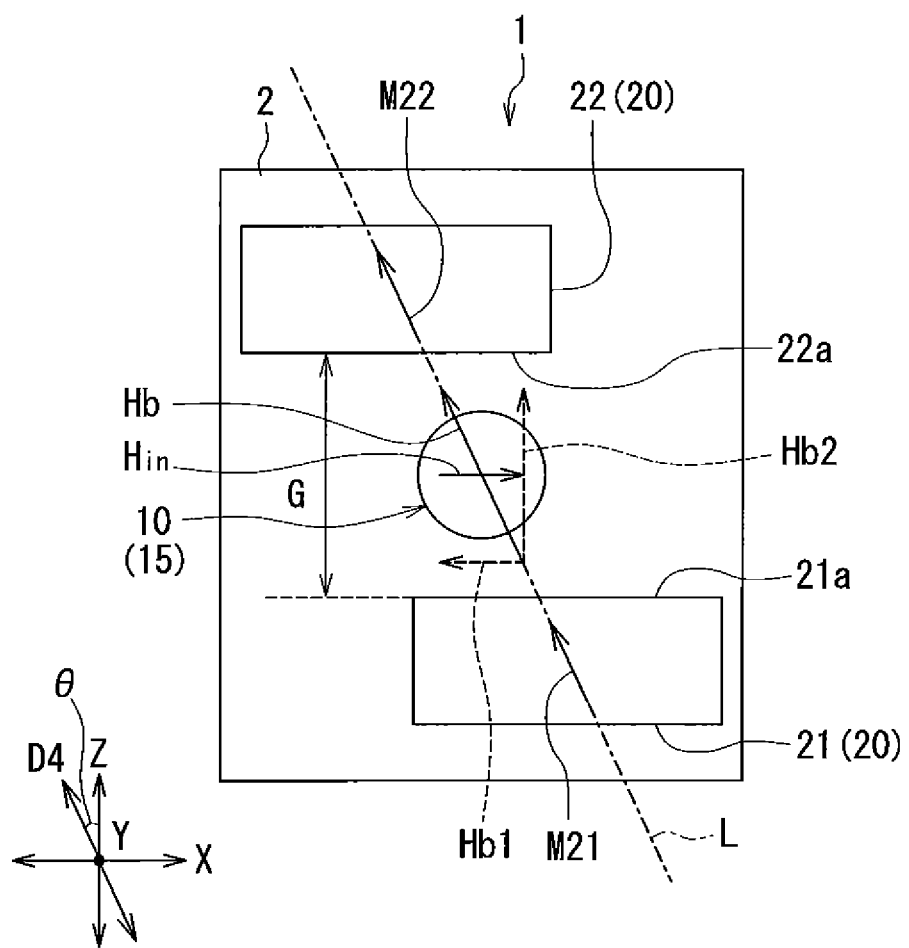
FIG. 8 is a plan view of a magnetic sensor according to a second embodiment of the invention.

A second embodiment of the invention will now be described with reference to FIG. 8. FIG. 8 is a plan view of the magnetic sensor 1 according to the second embodiment. In the second embodiment, the MR element 10 and the magnets 21 and 22 are aligned in the fourth direction D4 as in the first embodiment. Further, the magnetization M21 of the magnet 21 and the magnetization M22 of the magnet 22 are in the same direction parallel to the fourth direction D4. However, in the second embodiment, the end face 21a of the magnet 21 and the end face 22a of the magnet 22 are perpendicular to the Z direction. Thus, the direction of the magnetization M21 of the magnet 21 is inclined with respect to the Z direction perpendicular to the end face 21a, and the direction of the magnetization M22 of the magnet 22 is inclined with respect to the Z direction perpendicular to the end face 22a. Like the first embodiment, the second embodiment allows the magnets 21 and 22 to apply to the free layer 15 the bias magnetic field Hb including the first magnetic field component Hb1 and the second magnetic field component Hb2. In the second embodiment, however, the direction of the bias magnetic field Hb is not always parallel to the fourth direction D4.

The remainder of configuration, function and effects of the second embodiment are similar to those of the first embodiment.

Third Embodiment

Figure 9:
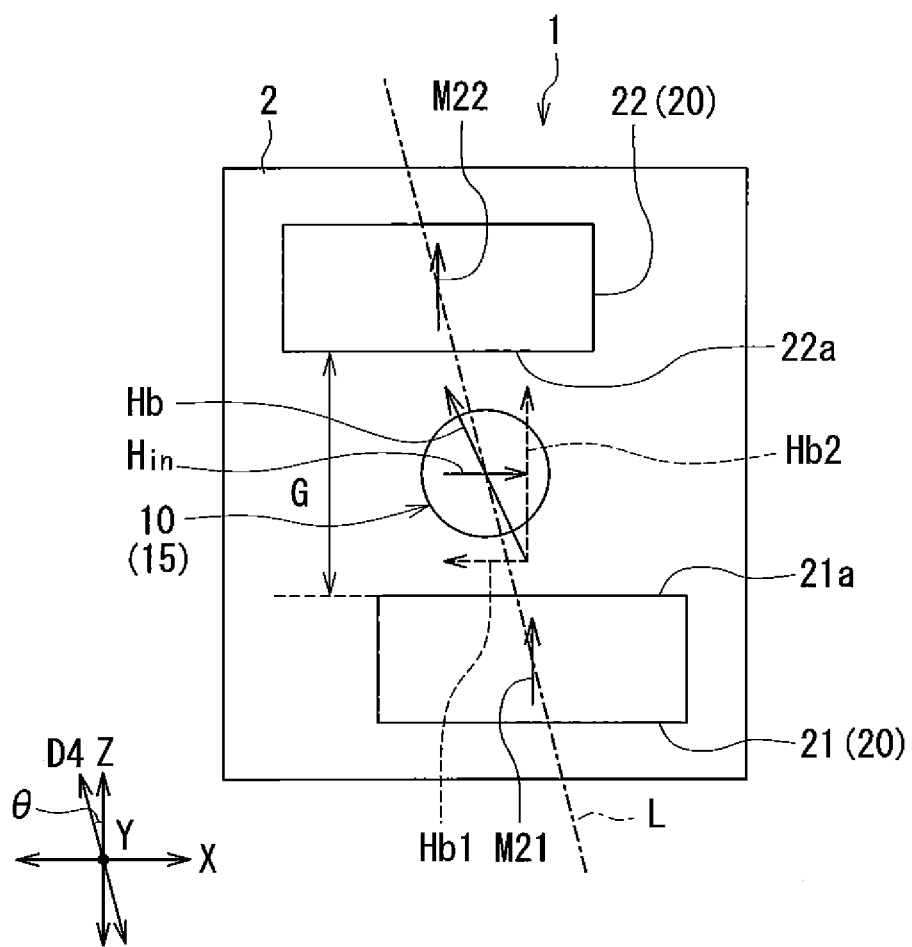
FIG. 9 is a plan view of a magnetic sensor according to a third embodiment of the invention.

A third embodiment of the invention will now be described with reference to FIG. 9. FIG. 9 is a plan view of the magnetic sensor 1 according to the third embodiment. In the third embodiment, the MR element 10 and the magnets 21 and 22 are aligned in the fourth direction D4, and the end faces 21a and 22a of the magnets 21 and 22 are perpendicular to the Z direction, as in the second embodiment. However, in the third embodiment, the magnetization M21 of the magnet 21 and the magnetization M22 of the magnet 22 are in the same direction parallel to the Z direction.

In the third embodiment, a magnetic flux produced by the magnets 21 and 22 and passing through the free layer 15 flows in a direction inclined with respect to both of the X direction and the Z direction. It is thus possible in the third embodiment to apply to the free layer 15 the bias magnetic field Hb including the first magnetic field component Hb1 and the second magnetic field component Hb2 through the use of the magnets 21 and 22, as in the first embodiment. In the third embodiment, however, the direction of the bias magnetic field Hb is not always parallel to the fourth direction D4.

The remainder of configuration, function and effects of the third embodiment are similar to those of the first embodiment.

Fourth Embodiment

Figure 10:
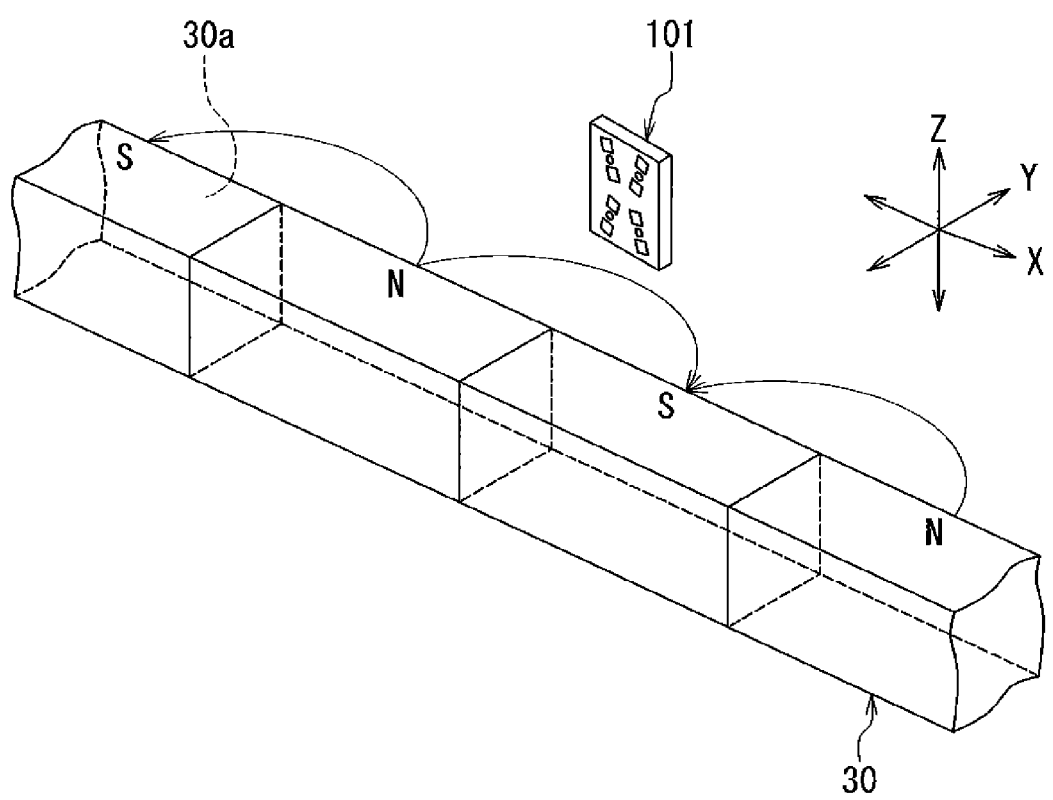
FIG. 10 is a perspective view illustrating the general configuration of a magnetic sensor system according to a fourth embodiment of the invention.

A fourth embodiment of the invention will now be described. FIG. 10 is a perspective view illustrating the general configuration of a magnetic sensor system according to the fourth embodiment. As shown in FIG. 10, the magnetic sensor system according to the fourth embodiment includes a magnetic sensor 101 according to the fourth embodiment and a scale 30 whose relative position with respect to the magnetic sensor 101 is variable in the X direction (the first direction). The scale 30 of the fourth embodiment is the same as that of the first embodiment. One of the magnetic sensor 101 and the scale 30 moves in the X direction in response to the movement of a moving object (not illustrated). This causes a change in the relative position of the scale 30 with respect to the magnetic sensor 101 in the X direction. In FIG. 10 the curved arrows indicate a magnetic flux produced by the scale 30. The magnetic sensor 101 is configured to detect the X-direction component of an external magnetic field. The external magnetic field is produced by the scale 30. A change in the relative position of the scale 30 with respect to the magnetic sensor 101 causes a change in the X-direction component Hx of the external magnetic field.

Figure 11:
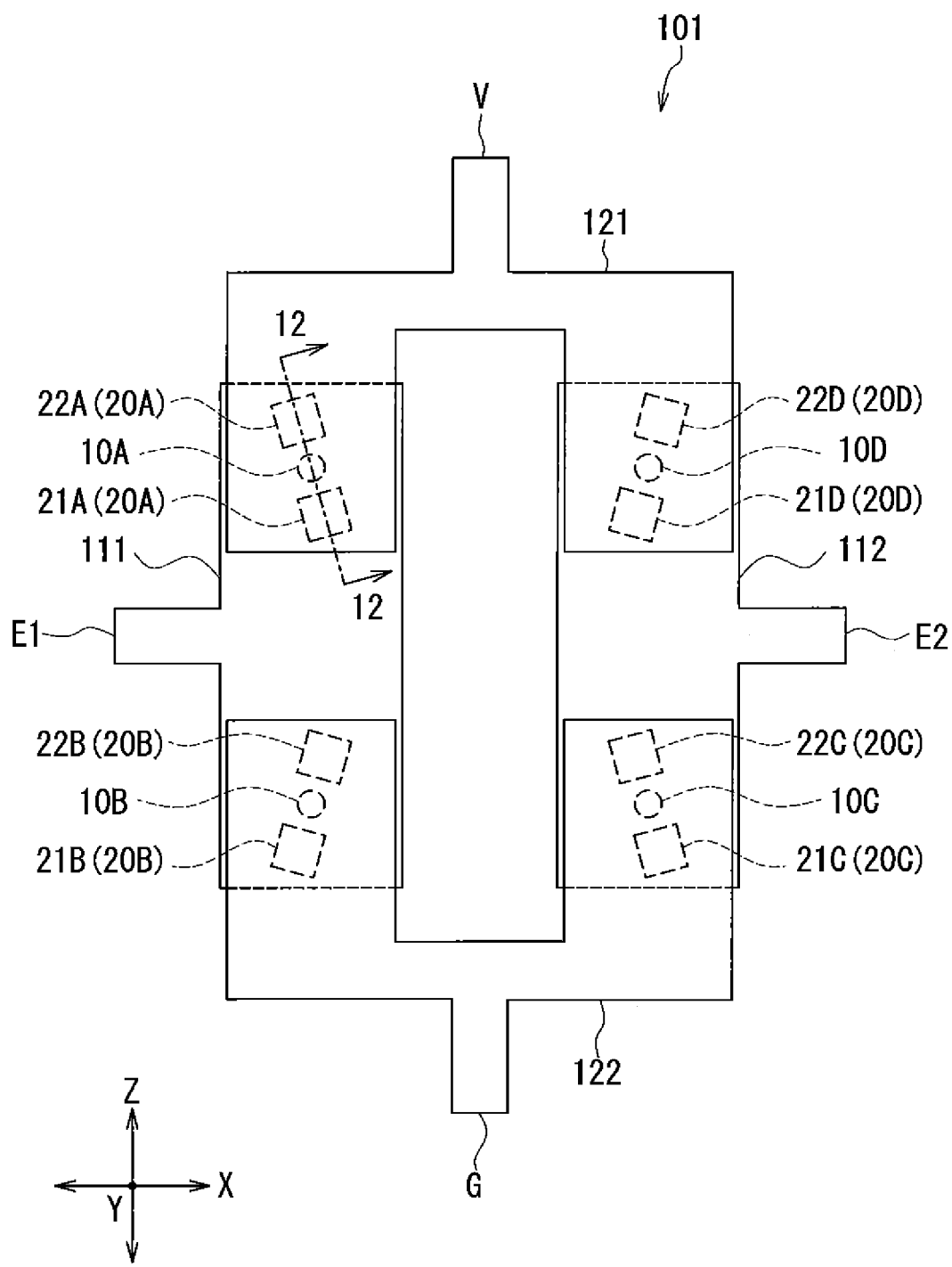
FIG. 11 is a plan view of a magnetic sensor according to the fourth embodiment of the invention.
Figure 12:
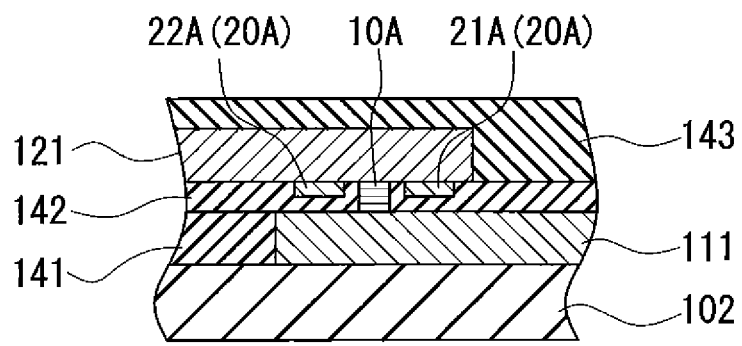
FIG. 12 is a cross-sectional view showing a cross section taken along line 12-12 of FIG. 11.

FIG. 11 is a plan view of the magnetic sensor 101. FIG. 12 is a cross-sectional view showing a cross section taken along line 12-12 of FIG. 11. The magnetic sensor 101 includes four spin-valve MR elements 10A, 10B, 10C and 10D, four bias field generation units 20A, 20B, 20C and 20D, a substrate 102, two lower electrodes 111 and 112, and two upper electrodes 121 and 122. Note that FIG. 11 omits the illustration of the substrate 102.

The lower electrodes 111 and 112 are disposed on the substrate 102. The magnetic sensor 101 further includes an insulating layer 141 (see FIG. 12) lying on the substrate 102 and surrounding the lower electrodes 111 and 112. The MR elements 10A and 10B are disposed on the lower electrode 111, while the MR elements 10C and 10D are disposed on the lower electrode 112. The magnetic sensor 101 further includes an insulating layer 142 (see FIG. 12) lying on the lower electrodes 111 and 112 and the insulating layer 141 and surrounding the MR elements 10A, 10B, 10C and 10D. The bias field generation units 20A, 20B, 20C and 20D are embedded in the insulating layer 142 so as not to be in contact with the lower electrodes 111 and 112 and the MR elements 10A, 10B, 10C and 10D. The top surfaces of the MR elements 10A, 10B, 10C and 10D, the bias field generation units 20A, 20B, 20C and 20D and the insulating layer 142 are flattened into one plane. The upper electrodes 121 and 122 are disposed on this plane. The upper electrode 121 is in contact with the top surfaces of the MR elements 10A and 10D. The upper electrode 122 is in contact with the top surfaces of the MR elements 10B and 10C. The magnetic sensor 101 further includes an insulating layer 143 (see FIG. 12) covering the upper electrodes 121 and 122.

As shown in FIG. 11, the upper electrode 121 includes a power supply port V. The upper electrode 122 includes a ground port G. The lower electrode 111 includes a first output port E1. The lower electrode 112 includes a second output port E2.

The MR elements 10A, 10B, 10C and 10D each have the same configuration as that of the MR element 10 of the first embodiment except the magnetization direction of the magnetization pinned layer 13. More specifically, each of the MR elements 10A, 10B, 10C and 10D includes the underlayer 11, the antiferromagnetic layer 12, the magnetization pinned layer 13, the nonmagnetic layer 14, the free layer 15, and the protective layer 16 arranged in this order from the bottom.

The magnetization pinned layer 13, the nonmagnetic layer 14 and the free layer 15 are stacked to be adjacent in the Y direction (the second direction) orthogonal to the X direction. The magnetization of the free layer 15 of each of the MR elements 10A, 10B, 100 and 10D varies depending on the X-direction component Hx (the component in the first direction) of the external magnetic field. All the MR elements 10A, 10B, 100 and 10D are of the CPP type.

The bias field generation units 20A, 20B, 20C and 20D apply bias magnetic fields to the free layers 15 of the MR elements 10A, 10B, 10C and 10D, respectively. Each of the bias field generation units 20A, 20B, 20C and 20D includes at least one magnet. The at least one magnet of each bias field generation unit may be spaced from the MR element. In the fourth embodiment, in particular, the at least one magnet of the bias field generation unit 20A is a pair of magnets 21A and 22A arranged with the MR element 10A in between, each of the magnets 21A and 22A being spaced from the MR element 10A. The at least one magnet of the bias field generation unit 20B is a pair of magnets 21B and 22B arranged with the MR element 10B in between, each of the magnets 21B and 22B being spaced from the MR element 10B. The at least one magnet of the bias field generation unit 20C is a pair of magnets 21C and 22C arranged with the MR element 10C in between, each of the magnets 21C and 22C being spaced from the MR element 10C. The at least one magnet of the bias field generation unit 20D is a pair of magnets 21D and 22D arranged with the MR element 10D in between, each of the magnets 21D and 22D being spaced from the MR element 10D.

The MR element 10A and the MR element 10B are connected in series via the lower electrode 111. The MR element 10C and the MR element 10D are connected in series via the lower electrode 112. The MR elements 10A and 10C each correspond to the first magnetoresistive element of the present invention. The MR elements 10B and 10D each correspond to the second magnetoresistive element of the present invention. The bias field generation units 20A and 20C each correspond to the first bias field generation unit of the present invention. The bias field generation units 20B and 20D each correspond to the second bias field generation unit of the present invention. Thus, the magnetic sensor 101 includes two sets of the first magnetoresistive element, the second magnetoresistive element, the first bias field generation unit and the second bias field generation unit.

The magnetization pinned layer 13 of each of the MR elements 10A and 10C corresponds to the first magnetization pinned layer of the present invention. The nonmagnetic layer 14 of each of the MR elements 10A and 10C corresponds to the first nonmagnetic layer of the present invention. The free layer 15 of each of the MR elements 10A and 10C corresponds to the first free layer of the present invention. The magnetization pinned layer 13 of each of the MR elements 10B and 10D corresponds to the second magnetization pinned layer of the present invention. The nonmagnetic layer 14 of each of the MR elements 10B and 10D corresponds to the second nonmagnetic layer of the present invention. The free layer 15 of each of the MR elements 10B and 10D corresponds to the second free layer of the present invention.

As will be described in detail later, the magnetizations of the magnetization pinned layers 13 of the MR elements 10A and 10C are pinned in the same direction parallel to the X direction (the first direction). The magnetizations of the magnetization pinned layers 13 of the MR elements 10B and 10D are pinned in a fifth direction opposite to the direction of the magnetizations of the magnetization pinned layers 13 of the MR elements 10A and 10C.

The magnets 21A and 22A correspond to the at least one first magnet of the present invention. The magnets 21B and 22B correspond to the at least one second magnet of the present invention. The magnets 21C and 22C correspond to the at least one first magnet of the present invention. The magnets 21D and 22D correspond to the at least one second magnet of the present invention.

Figure 13:
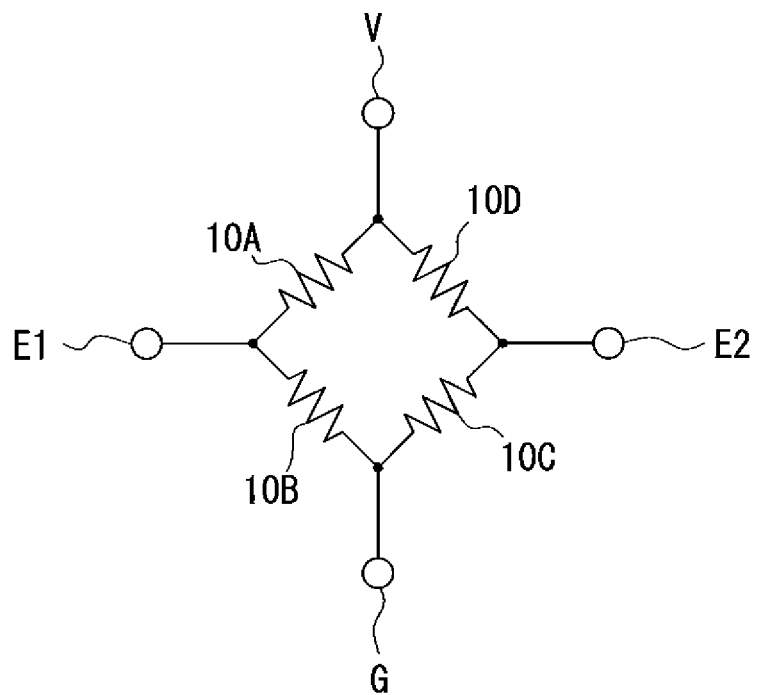
FIG. 13 is a circuit diagram of the magnetic sensor according to the fourth embodiment of the invention.

FIG. 13 is a circuit diagram of the magnetic sensor 101. As shown in FIG. 13, one end of the MR element 10A is connected to the power supply port V. The other end of the MR element 10A is connected to the first output port E1. One end of the MR element 10B is connected to the first output port E1. The other end of the MR element 10B is connected to the ground port G. The MR elements 10A and 10B constitute a half-bridge circuit. One end of the MR element 10C is connected to the second output port E2. The other end of the MR element 10C is connected to the ground port G. One end of the MR element 10D is connected to the power supply port V. The other end of the MR element 10D is connected to the second output port E2. The MR elements 10C and 10D constitute a half-bridge circuit. The MR elements 10A, 10B, 10C and 10D constitute a Wheatstone bridge circuit.

A power supply voltage of a predetermined magnitude is applied to the power supply port V1. The ground port G is grounded. Each of the MR elements 10A, 10B, 10C and 10D varies in resistance depending on the X-direction component Hx of the external magnetic field. The resistances of the MR elements 10A and 10C vary in phase with each other. The resistances of the MR elements 10B and 10D vary 180° out of phase with the resistances of the MR elements 10A and 10C. The first output port E1 outputs a first detection signal corresponding to the potential at the connection point between the MR elements 10A and 10B. The second output port E2 outputs a second detection signal corresponding to the potential at the connection point between the MR elements 10D and 10C. The first and second detection signals vary depending on the X-direction component Hx of the external magnetic field. The second detection signal is 180° out of phase with the first detection signal. The magnetic sensor 101 generates an output signal by computation including determining the difference between the first detection signal and the second detection signal. For example, the output signal of the magnetic sensor 101 is generated by adding a predetermined offset voltage to a signal obtained by subtracting the second detection signal from the first detection signal. The output signal of the magnetic sensor 101 varies depending on the X-direction component Hx of the external magnetic field.

Figure 14:
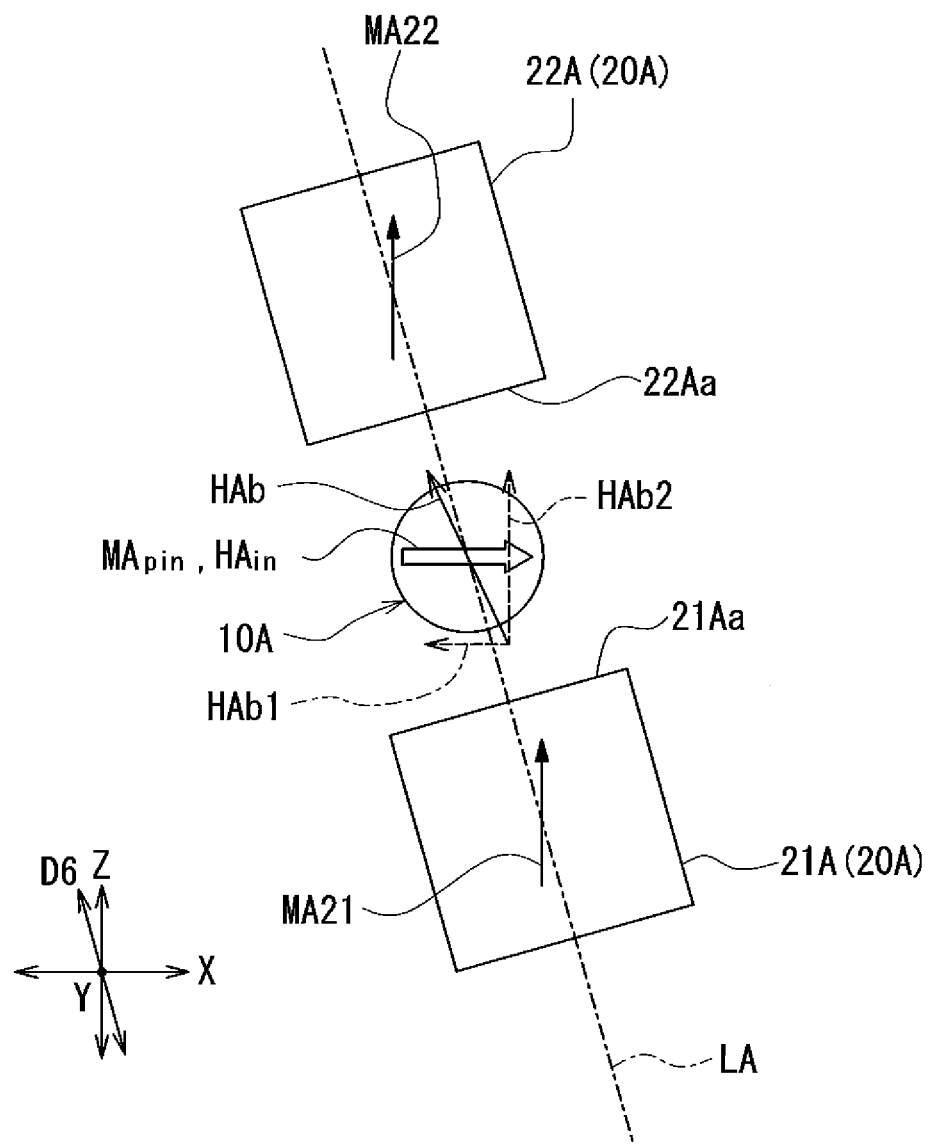
FIG. 14 is a plan view illustrating a first magnetoresistive element and a first bias field generation unit of the magnetic sensor according to the fourth embodiment of the invention.

Now, the features of the magnetic sensor 101 will be described with reference to FIG. 14 and FIG. 15. FIG. 14 is a plan view illustrating the MR element 10A or the first magnetoresistive element and the bias field generation unit 20A or the first bias field generation unit. The magnetization pinned layer 13 of the MR element 10A has a magnetization MApin pinned in a direction parallel to the X direction (the first direction). The free layer 15 of the MR element 10A receives an interlayer coupling magnetic field HAin in the direction parallel to the X direction (the first direction) resulting from the magnetization pinned layer 13 of the MR element 10A. The interlayer coupling magnetic field HAin corresponds to the first interlayer coupling magnetic field of the present invention. The direction of the interlayer coupling magnetic field HAin is the same as or opposite to the direction of the magnetization MApin of the magnetization pinned layer 13 of the MR element 10A. In FIG. 14, the hollow arrow indicates the direction of the magnetization MApin and the direction of the interlayer coupling magnetic field HAin. FIG. 14 illustrates an example in which the direction of the interlayer coupling magnetic field HAin is the same as the direction of the magnetization MApin.

The bias field generation unit 20A or a pair of magnets 21A, 22A applies a bias magnetic field HAb to the free layer 15 of the MR element 10A. The bias magnetic field HAb includes a first magnetic field component HAb1 in a direction opposite to the direction of the interlayer coupling magnetic field HAin and a second magnetic field component HAb2 in the Z direction (the third direction) orthogonal to the X and Y directions.

The MR element 10A and the pair of magnets 21A and 22A are aligned in a sixth direction D6 inclined with respect to both of the X direction and the Z direction. More specifically, when viewed in the Y direction, the centers of the MR element 10A and the magnets 21A and 22A are collinear along a straight line LA extending in the sixth direction D6, as shown in FIG. 14. In the fourth embodiment, the magnets 21A and 22A have magnetizations MA21 and MA22 in the same direction parallel to the Z direction (the third direction).

The magnets 21A and 22A each have a rectangular solid shape, for example. The magnet 21A has an end face 21Aa facing the MR element 10A. The magnet 22A has an end face 22Aa facing the MR element 10A. The end faces 21Aa and 22Aa are perpendicular to the sixth direction D6. In the example shown in FIG. 14, the N pole of the magnet 21A appears at the end face 21Aa while the S pole of the magnet 22A appears at the end face 22Aa. A magnetic flux produced by the magnets 21A and 22A and passing through the free layer 15 of the MR element 10A flows in a direction inclined with respect to both of the X direction and the Z direction. It is thus possible to apply the bias magnetic field HAb including the first magnetic field component HAb1 and the second magnetic field component HAb2 to the free layer 15 of the MR element 10A through the use of the magnets 21A and 22A. However, the direction of the bias magnetic field HAb is not always parallel to the sixth direction D6. The first magnetic field component HAb1 and the second magnetic field component HAb2 can be adjusted by the distance between the magnets 21A and 22A and the angle that the sixth direction D6 forms with respect to the Z direction.

Although not illustrated, the bias field generation unit 20C (the magnets 21C and 22C) and the MR element 10C are arranged in the same positional relationship as that between the bias field generation unit 20A (the magnets 21A and 22A) and the MR element 10A. The magnets 21C and 22C have magnetizations in the direction the same as the direction of the magnetizations MA21 and MA22 shown in FIG. 14. The magnetization pinned layer 13 of the MR element 10C has a magnetization MCpin pinned in the same direction as the magnetization MApin of the magnetization pinned layer 13 of the MR element 10A. The free layer 15 of the MR element 10C receives an interlayer coupling magnetic field HCin in the direction parallel to the X direction (the first direction) resulting from the magnetization pinned layer 13 of the MR element 10C. The interlayer coupling magnetic field HCin corresponds to the first interlayer coupling magnetic field of the present invention.

The bias field generation unit 20C or a pair of magnets 21C, 22C applies a bias magnetic field HCb to the free layer 15 of the MR element 10C. The bias magnetic field HCb includes a first magnetic field component HCb1 in a direction opposite to the direction of the interlayer coupling magnetic field HCin and a second magnetic field component HCb2 in the Z direction (the third direction) orthogonal to the X and Y directions. The directions of the interlayer coupling magnetic field HCin, the bias magnetic field HCb, the first magnetic field component HCb1 and the second magnetic field component HCb2 are the same as those of the interlayer coupling magnetic field HAin, the bias magnetic field HAb, the first magnetic field component HAb1 and the second magnetic field component HAb2, respectively.

Figure 15:
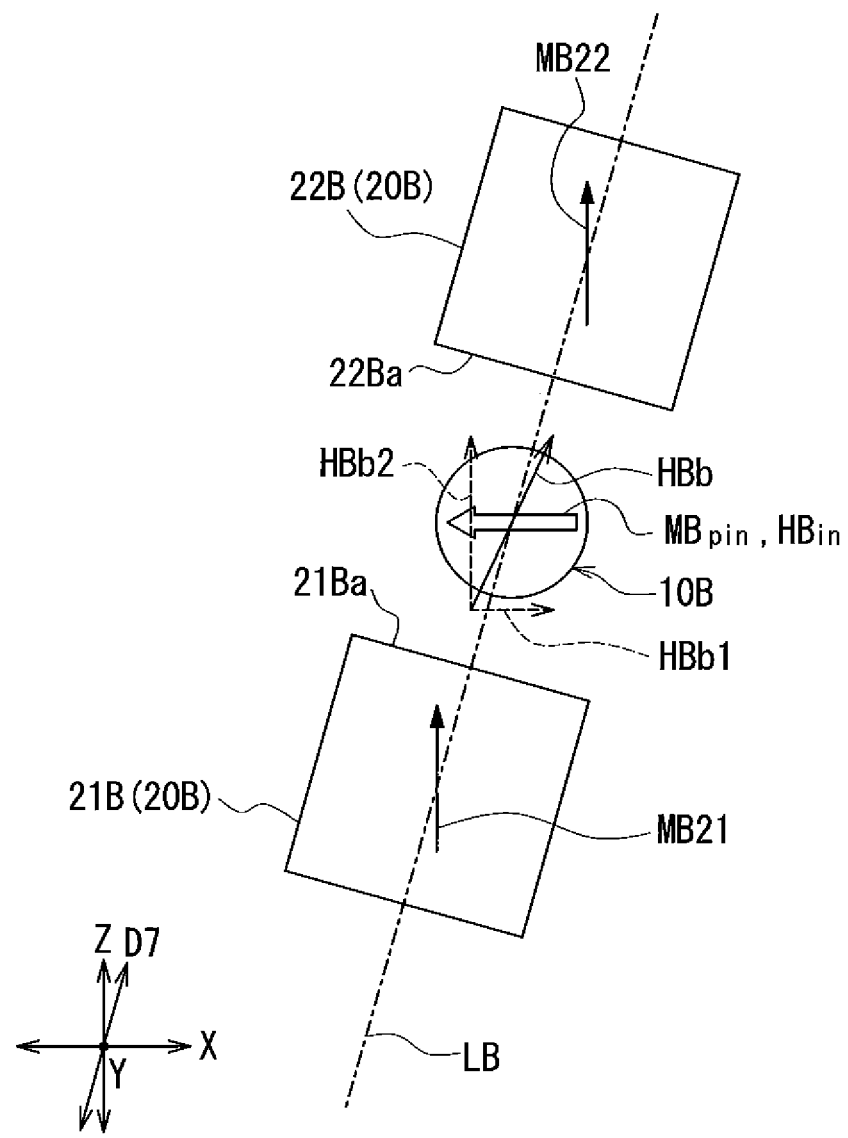
FIG. 15 is a plan view illustrating a second magnetoresistive element and a second bias field generation unit of the magnetic sensor according to the fourth embodiment of the invention.

FIG. 15 is a plan view illustrating the MR element 10B or the second magnetoresistive element and the bias field generation unit 20B or the second bias field generation unit. The magnetization pinned layer 13 of the MR element 10B has a magnetization MBpin which is pinned in the fifth direction opposite to the direction of the magnetizations of the magnetization pinned layers 13 of the MR elements 10A and 10C, as previously mentioned. The free layer 15 of the MR element 10B receives an interlayer coupling magnetic field HBin resulting from the magnetization pinned layer 13 of the MR element 10B, the interlayer coupling magnetic field HBin being in a direction opposite to the direction of the interlayer coupling magnetic fields HAin and HCin. The interlayer coupling magnetic field HBin corresponds to the second interlayer coupling magnetic field of the present invention. The direction of the interlayer coupling magnetic field HBin is the same as or opposite to the direction of the magnetization MBpin of the magnetization pinned layer 13 of the MR element 10B. In FIG. 15, the hollow arrow indicates the direction of the magnetization MBpin and the direction of the interlayer coupling magnetic field HBin. FIG. 15 illustrates an example in which the direction of the interlayer coupling magnetic field HBin is the same as the direction of the magnetization MBpin.

The bias field generation unit 20B or a pair of magnets 21B, 22B applies a bias magnetic field HBb to the free layer 15 of the MR element 10B. The bias magnetic field HBb includes a third magnetic field component HBb1 in a direction opposite to the direction of the interlayer coupling magnetic field HBin and a fourth magnetic field component HBb2 in the Z direction (the third direction).

The MR element 10B and the pair of magnets 21B and 22B are aligned in a seventh direction D7 inclined with respect to both of the X direction and the Z direction. More specifically, when viewed in the Y direction, the centers of the MR element 10B and the magnets 21B and 22B are collinear along a straight line LB extending in the seventh direction D7, as shown in FIG. 15. In the fourth embodiment, the magnets 21B and 22B have magnetizations MB21 and MB22 in the same direction parallel to the Z direction (the third direction). The direction of the magnetizations MB21 and MB22 is the same as the direction of the magnetizations MA21 and MA22 shown in FIG. 14.

The magnets 21B and 22B each have a rectangular solid shape, for example. The magnet 21B has an end face 21Ba facing the MR element 10B. The magnet 22B has an end face 22Ba facing the MR element 10B. The end faces 21Ba and 22Ba are perpendicular to the seventh direction D7. In the example shown in FIG. 15, the N pole of the magnet 21B appears at the end face 21Ba while the S pole of the magnet 22B appears at the end face 22Ba. A magnetic flux produced by the magnets 21B and 22B and passing through the free layer 15 of the MR element 10B flows in a direction inclined with respect to both of the X direction and the Z direction. It is thus possible to apply the bias magnetic field HBb including the third magnetic field component HBb1 and the fourth magnetic field component HBb2 to the free layer 15 of the MR element 10B through the use of the magnets 21B and 22B. However, the direction of the bias magnetic field HBb is not always parallel to the seventh direction D7. The third magnetic field component HBb1 and the fourth magnetic field component HBb2 can be adjusted by the distance between the magnets 21B and 22B and the angle that the seventh direction D7 forms with respect to the Z direction.

As shown in FIG. 14 and FIG. 15, the sixth direction D6 and the seventh direction D7 are inclined in mutually opposite directions with respect to the Z direction (the third direction). Similarly, the bias magnetic field HAb and the bias magnetic field HBb are also inclined in mutually opposite directions with respect to the Z direction (the third direction).

Although not illustrated, the bias field generation unit 20D (the magnets 21D and 22D) and the MR element 10D are arranged in the same positional relationship as that between the bias field generation unit 20B (the magnets 21B and 22B) and the MR element 10B. The magnets 21D and 22D have magnetizations in the direction same as the direction of the magnetizations MA21 and MA22 shown in FIG. 14 and the direction of the magnetizations MB21 and MB22 shown in FIG. 15. The magnetization pinned layer 13 of the MR element 10D has a magnetization MDpin pinned in the same direction as the magnetization MBpin of the magnetization pinned layer 13 of the MR element 10B. The free layer 15 of the MR element 10D receives an interlayer coupling magnetic field HDin resulting from the magnetization pinned layer 13 of the MR element 10D, the interlayer coupling magnetic field HDin being in the direction opposite to the direction of the interlayer coupling magnetic fields HAin and HCin. The interlayer coupling magnetic field HDin corresponds to the second interlayer coupling magnetic field of the present invention.

The bias field generation unit 20D or a pair of magnets 21D, 22D applies a bias magnetic field HDb to the free layer 15 of the MR element 10D. The bias magnetic field HDb includes a third magnetic field component HDb1 in a direction opposite to the direction of the interlayer coupling magnetic field HDin and a fourth magnetic field component HDb2 in the Z direction (the third direction). The directions of the interlayer coupling magnetic field HDin, the bias magnetic field HDb, the third magnetic field component HDb1 and the fourth magnetic field component HDb2 are the same as those of the interlayer coupling magnetic field HBin, the bias magnetic field HBb, the third magnetic field component HBb1 and the fourth magnetic field component HBb2, respectively.

The function and effects of the magnetic sensor 101 and the magnetic sensor system according to the fourth embodiment will now be described. In the magnetic sensor system according to the fourth embodiment, the scale 30 produces an external magnetic field to be detected by the magnetic sensor 101, as with the first embodiment. A change in the relative position of the scale 30 with respect to the magnetic sensor 101 causes a change in the X-direction component Hx of the external magnetic field. The output signal of the magnetic sensor 101 varies depending on the X-direction component Hx of the external magnetic field. The output signal of the magnetic sensor 101 allows for detection of a physical quantity associated with the linear movement of a moving object, such as the relative position and/or speed of the scale 30 with respect to the magnetic sensor 101.

In the fourth embodiment, the magnetic field components HAb1, HBb1, HCb1 and HDb1 act to cancel out the interlayer coupling magnetic fields HAin, HBin, HCin and HDin, respectively. This makes it possible to reduce the effects of the interlayer coupling fields HAin, HBin, HCin and HDin received by the free layers 15 of the MR elements 10A, 10B, 10C and 10D, respectively.

On the other hand, the magnetic field components HAb2, HBb2, HCb2 and HDb2 act to stabilize the magnetization directions of the free layers 15 of the MR elements 10A, 10B, 10C and 10D, respectively, when the X-direction component Hx of the external magnetic field is zero. This makes it possible to prevent the output signal waveform of the magnetic sensor 101 from becoming unstable due to the cancellation of the interlayer coupling magnetic fields HAin, HBin, HCin and HDin by the magnetic field components HAb1, HBb1, HCb1 and HDb1, respectively.

Figure 16:
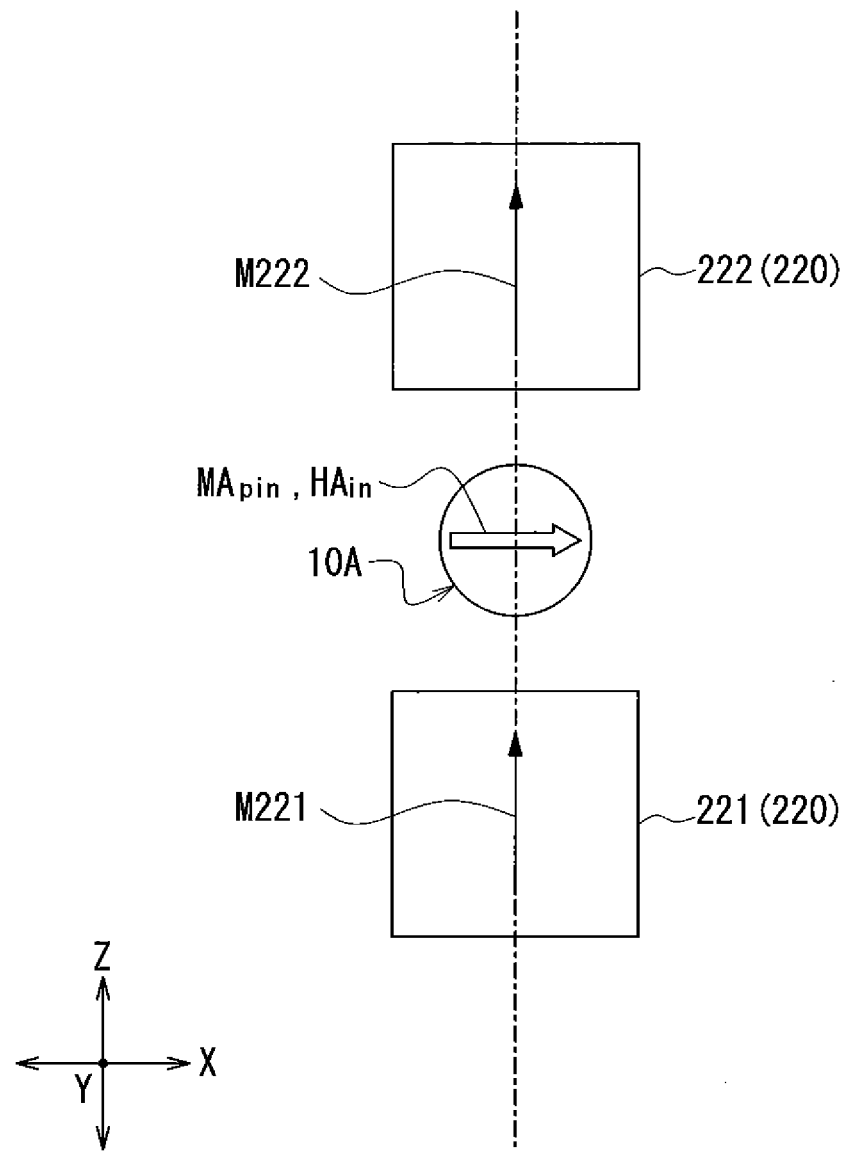
FIG. 16 is a plan view illustrating an MR element and a bias field generation unit of a magnetic sensor of a comparative example.

Now, the effects of the magnetic sensor 101 according to the fourth embodiment resulting from the magnetic field components HAb1, HBb1, HCb1 and HDb1 will be described in detail in comparison with a magnetic sensor of a comparative example. To begin with, the configuration of the magnetic sensor of the comparative example will be described with reference to FIG. 16. FIG. 16 is a plan view illustrating an MR element and a bias field generation unit of the magnetic sensor of the comparative example. The magnetic sensor of the comparative example includes four bias field generation units 220 in place of the bias field generation units 20A, 20B, 20C and 20D of the magnetic sensor 101. The four bias field generation units 220 apply bias magnetic fields to the free layers 15 of the MR elements 10A, 10B, 10C and 10D. FIG. 16 shows one of the bias field generation units 220 that applies a bias magnetic field to the free layer 15 of the MR element 10A.

The bias field generation unit 220 shown in FIG. 16 includes a pair of magnets 221 and 222 arranged with the MR element 10A in between, each of the magnets 221 and 222 being spaced from the MR element 10A. The MR element 10A and the magnets 221 and 222 are aligned in the Z direction. The magnets 221 and 222 have magnetizations M221 and M222 in the same direction parallel to the Z direction. The pair of magnets 221, 222 applies a bias magnetic field to the free layer 15 of the MR element 10A. The bias magnetic field is in the Z direction.

Although not illustrated, in the magnetic sensor of the comparative example, the other three bias field generation units to apply bias magnetic fields to the free layers 15 of the MR elements 10B, 10C and 10D are configured in the same manner as the bias field generation unit 220 shown in FIG. 16.

In the magnetic sensor of the comparative example, the four bias magnetic fields applied to the free layers 15 of the MR elements 10A, 10B, 10C and 10D by the four bias field generation units 220 do not include any components to cancel out the interlayer coupling magnetic fields HAin, HBin, HCin and HDin, respectively. Thus, the magnetic sensor of the comparative example is unable to reduce the effects of the interlayer coupling magnetic fields HAin, HBin, HCin and HDin received by the free layers 15 of the MR elements 10A, 10B, 10C and 10D, respectively.

Figure 17:
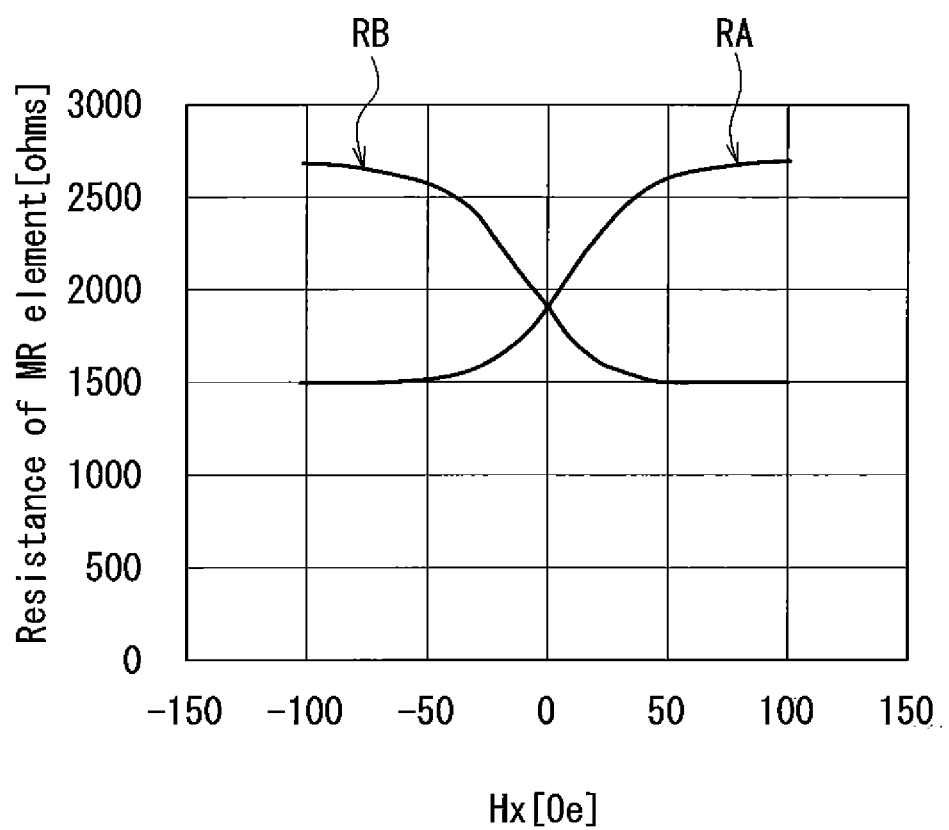
FIG. 17 is a characteristic diagram illustrating an example of the relationship between the component in the X direction of the external magnetic field and the resistances of two MR elements in the magnetic sensor of the comparative example.

FIG. 17 is a characteristic diagram illustrating an example of the relationship between the X-direction component Hx of the external magnetic field and the resistances of two MR elements in the magnetic sensor of the comparative example. In FIG. 17, the horizontal axis represents the X-direction component Hx of the external magnetic field, and the vertical axis represents the resistance of each MR element. The horizontal axis is expressed in oersteds (Oe) (1 Oe=79.6 A/m) and the vertical axis is expressed in ohms. In FIG. 17, the curve labeled RA shows the change in the resistance of the MR element 10A with respect to the change in the X-direction component Hx, while the curve labeled RB shows the change in the resistance of the MR element 10B with respect to the change in the X-direction component Hx. In FIG. 17, the magnitude of the X-direction component Hx when the X-direction component Hx is oriented in the opposite direction to the magnetization MApin is expressed in positive values, and the magnitude of the X-direction component Hx when the X-direction component Hx is oriented in the same direction as the magnetization MApin is expressed in negative values. The change in the resistance of the MR element 10C with respect to the change in the X-direction component Hx is similar to the change in the resistance of the MR element 10A with respect to the change in the X-direction component Hx. The change in the resistance of the MR element 10D with respect to the change in the X-direction component Hx is similar to the change in the resistance of the MR element 10B with respect to the change in the X-direction component Hx.

In the magnetic sensor of the comparative example, as shown in FIG. 17, the amounts of change in the resistances of the MR elements 10A, 10B, 10C and 10D with respect to the change in the magnitude of the X-direction component Hx vary depending on the direction of the X-direction component Hx due to the effects of the interlayer coupling magnetic fields HAin, HBin, HCin and HDin received by the free layers 15 of the MR elements 10A, 10B, 10C and 10D, respectively. Further, when the X-direction component Hx is around zero, the amounts of change in the resistances of the MR elements 10A, 10B, 10C and 10D with respect to the change in the magnitude of the X-direction component Hx are reduced due to the effects of the interlayer coupling magnetic fields HAin, HBin, HCin and HDin received by the free layers 15 of the MR elements 10A, 10B, 10C and 10D, respectively. Consequently, the magnetic sensor of the comparative example produces an output signal of low sensitivity.

Figure 18:
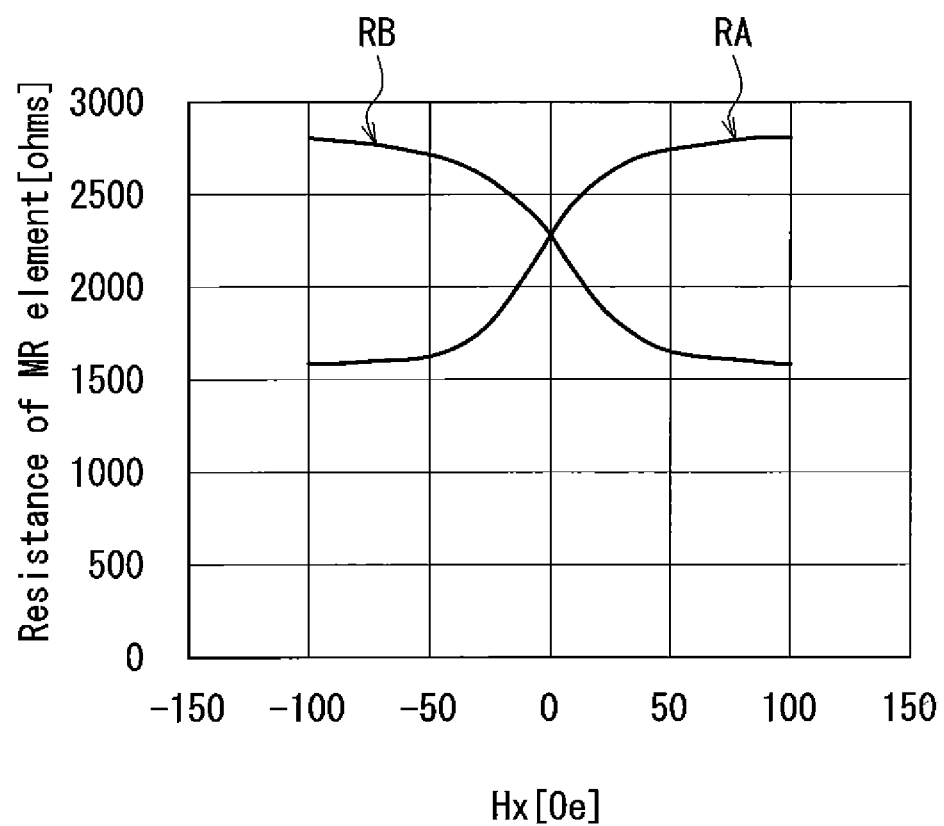
FIG. 18 is a characteristic diagram illustrating an example of the relationship between the component in the X direction of the external magnetic field and the resistances of two MR elements in the magnetic sensor according to the fourth embodiment of the invention.

FIG. 18 is a characteristic diagram illustrating an example of the relationship between the X-direction component of the external magnetic field and the resistances of two MR elements in the magnetic sensor 101 according to the fourth embodiment. The horizontal axis and the vertical axis of FIG. 18 are the same as those of FIG. 17. In FIG. 18, the curve labeled RA shows the change in the resistance of the MR element 10A with respect to the change in the X-direction component Hx, while the curve labeled RB shows the change in the resistance of the MR element 10B with respect to the change in the X-direction component Hx. In FIG. 18, the magnitude of the X-direction component Hx when the X-direction component Hx is oriented in the opposite direction to the magnetization MApin is expressed in positive values, and the magnitude of the X-direction component Hx when the X-direction component Hx is oriented in the same direction as the magnetization MApin is expressed in negative values. The change in the resistance of the MR element 100 with respect to the change in the X-direction component Hx is similar to the change in the resistance of the MR element 10A with respect to the change in the X-direction component Hx. The change in the resistance of the MR element 10D with respect to the change in the X-direction component Hx is similar to the change in the resistance of the MR element 10B with respect to the change in the X-direction component Hx.

In the magnetic sensor 101, the effects of the interlayer coupling magnetic fields HAin, HBin, HCin and HDin received by the free layers 15 of the MR elements 10A, 10B, 10C and 10D, respectively, are reduced. Consequently, as shown in FIG. 18, the amount of change in the resistance of each of the MR elements 10A, 10B, 10C and 10B with respect to the change in the magnitude of the X-direction component Hx is almost the same between the positive-value region for the X-direction component Hx and the negative-value region for the X-direction component Hx. Further, when the X-direction component Hx is around zero, the amount of change in the resistance of each of the MR elements 10A, 10B, 10C and 10B with respect to the change in the magnitude of the X-direction component Hx is greater in the magnetic sensor 101 than in the magnetic sensor of the comparative example.

The magnetic sensor 101 thus produces an output signal of higher sensitivity when compared with the magnetic sensor of the comparative example.

As described above, the magnetic sensor 101 and the magnetic sensor system employing the spin-valve MR elements 10A, 10B, 10C and 10D according to the fourth embodiment are capable of reducing the effects of the interlayer coupling magnetic fields HAin, HBin, HCin and HDin received by the free layers 15 of the spin-valve MR elements 10A, 10B, 10C and 10D, respectively.

In the magnetic sensor 101 according to the fourth embodiment, the MR elements 10A, 10B, 10C and 10D constitute a Wheatstone bridge circuit as shown in FIG. 13. In the magnetic sensor 101, the first detection signal outputted from the first output port E1 is twice as sensitive as the output signal of the magnetic sensor 1 corresponding to the resistance of one MR element 10 of the first embodiment. Similarly, the second detection signal outputted from the second output port E2 is twice as sensitive as the output signal of the magnetic sensor 1. Then, the output signal of the magnetic sensor 101 generated by computation including determining the difference between the first detection signal and the second detection signal is four times as sensitive as the output signal of the magnetic sensor 1. The fourth embodiment thus allows the magnetic sensor 101 to produce an output signal of higher sensitivity when compared with the first embodiment.

Thus, the fourth embodiment provides the magnetic sensor 101 of a Wheatstone bridge circuit configuration which produces an output signal of inherently high sensitivity, and achieves a further enhanced sensitivity of the output signal of the magnetic sensor 101 by reducing the effects of the interlayer coupling magnetic fields HAin, HBin, HCin and HDin.

In the fourth embodiment, the magnetization direction of the magnetization pinned layers 13 of the MR elements 10A and 10C is opposite to the magnetization direction of the magnetization pinned layers 13 of the MR elements 10B and 10D. Consequently, the direction of the interlayer coupling magnetic fields HAin and HCin is opposite to the direction of the interlayer coupling magnetic fields HBin and HDin. To reduce the effects of the interlayer coupling magnetic fields HAin, HBin, HCin and HDin in the fourth embodiment, it is thus necessary that the direction of the bias magnetic fields HAb and HCb and the direction of the bias magnetic fields HBb and HDb be different from each other. In the fourth embodiment, the direction of the bias magnetic fields HAb and HCb and the direction of the bias magnetic fields HBb and HDb are adjusted to be different from each other while the magnetizations of all the magnets 21A, 22A, 21B, 22B, 21C, 22C, 21D and 22D are oriented in the same direction. This is accomplished by inclining the sixth direction D6 and the seventh direction D7 in mutually opposite directions with respect to the Z direction (the third direction), as shown in FIG. 15. The sixth direction D6 is the direction in which the MR element 10A and the magnets 21A and 22A are aligned, and also the direction in which the MR element 10C and the magnets 21C and 22C are aligned. The seventh direction D7 is the direction in which the MR element 10B and the magnets 21B and 22B are aligned, and also the direction in which the MR element 10D and the magnets 21D and 22D are aligned.

The fourth embodiment makes it possible to magnetize the magnets 21A, 22A, 21B, 22B, 21C, 22C, 21D and 22D simultaneously by using magnetic fields oriented in the same direction. Thus, the fourth embodiment facilitates the manufacture of the magnetic sensor 101 which produces an output signal of high sensitivity as described above.

In the fourth embodiment, the end faces of the magnets 21A and 22A facing the MR element 10A, the end faces of the magnets 21B and 22B facing the MR element 10B, the end faces of the magnets 21C and 22C facing the MR element 10C, and the end faces of the magnets 21D and 22D facing the MR element 10D may be perpendicular to the Z direction.

Further, the magnetic sensor 101 may include a plurality of sets of the MR element 10A and the bias field generation unit 20A, a plurality of sets of the MR element 10B and the bias field generation unit 20B, a plurality of sets of the MR element 10C and the bias field generation unit 20C, and a plurality of sets of the MR element 10D and the bias field generation unit 20D. In such a case, the MR elements 10A in the plurality of sets are connected in series to form a first string of MR elements, the MR elements 10B in the plurality of sets are connected in series to form a second string of MR elements, the MR elements 10C in the plurality of sets are connected in series to form a third string of MR elements, and the MR elements 10D in the plurality of sets are connected in series to form a fourth string of MR elements. Then, the first to fourth strings of MR elements constitute a Wheatstone bridge circuit.

The remainder of configuration, function and effects of the fourth embodiment are similar to those of the first embodiment.

Fifth Embodiment

Figure 19:
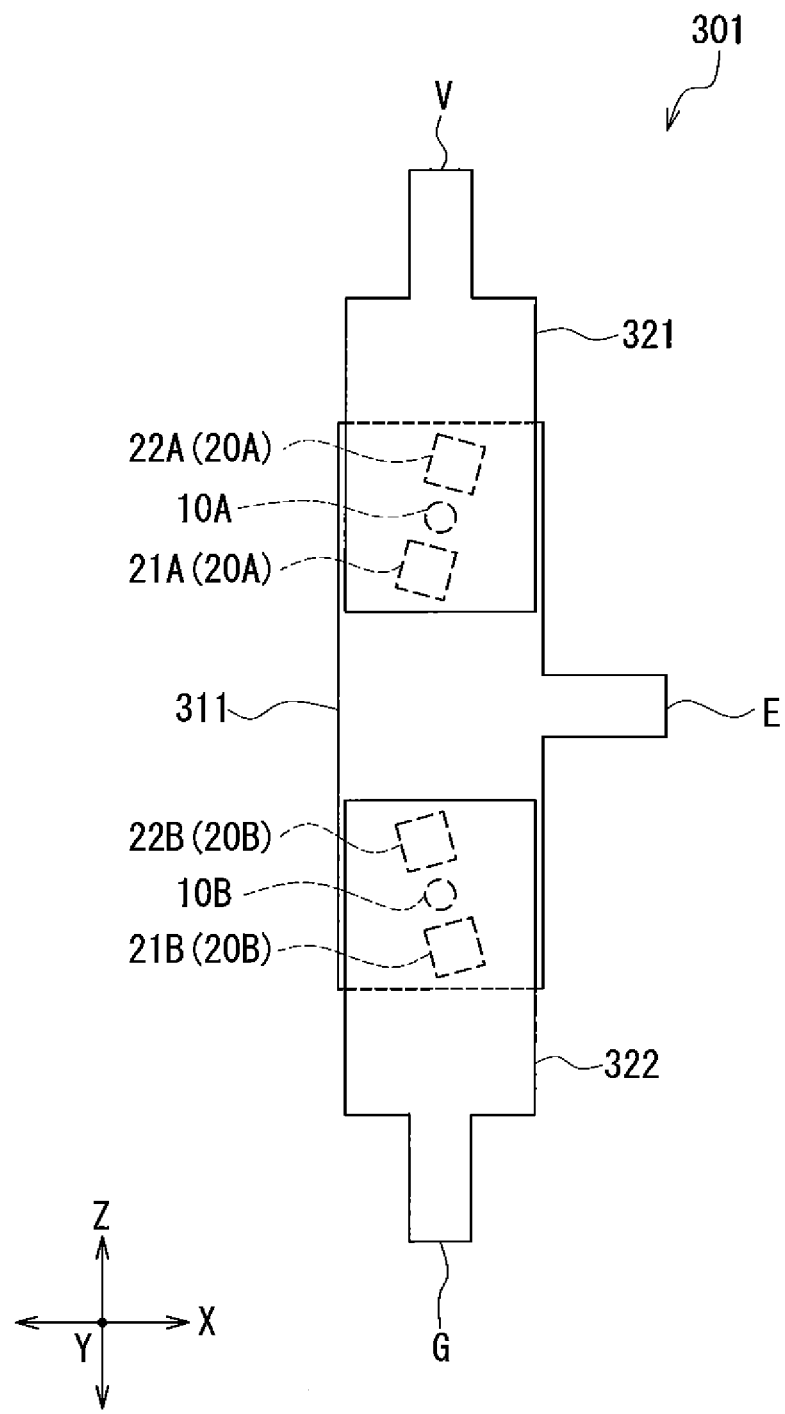
FIG. 19 is a plan view of a magnetic sensor according to a fifth embodiment of the invention.
Figure 20:
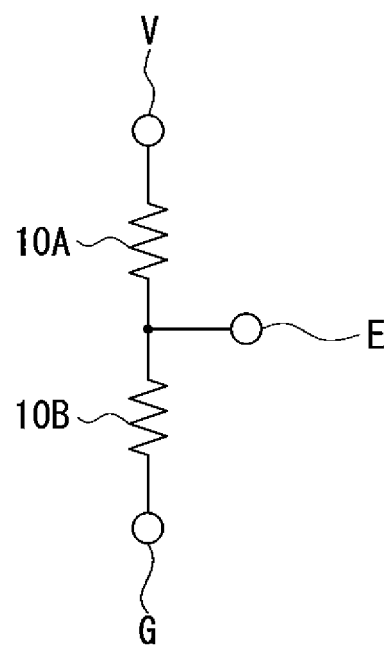
FIG. 20 is a circuit diagram of the magnetic sensor according to the fifth embodiment of the invention.

A fifth embodiment of the invention will now be described with reference to FIG. 19 and FIG. 20. A magnetic sensor system according to the fifth embodiment includes a magnetic sensor 301 according to the fifth embodiment, in place of the magnetic sensor 101 according to the fourth embodiment. FIG. 19 is a plan view of the magnetic sensor 301. FIG. 20 is a circuit diagram of the magnetic sensor 301.

The magnetic sensor 301 differs from the magnetic sensor 101 according to the fourth embodiment in the following ways. As shown in FIG. 19, the magnetic sensor 301 includes the MR elements 10A and 10B and the bias field generation units 20A and 20B, but does not include the MR elements 10C and 10D and the bias field generation units 20C and 20D. Further, the magnetic sensor 301 includes a single lower electrode 311 in place of the two lower electrodes 111 and 112 of the magnetic sensor 101, and includes two upper electrodes 321 and 322 in place of the two upper electrodes 121 and 122 of the magnetic sensor 101.

The MR elements 10A and 10B are disposed on the lower electrode 311. The upper electrode 321 is in contact with the top surface of the MR element 10A. The upper electrode 322 is in contact with the top surface of the MR element 10B. The upper electrode 321 includes a power supply port V. The upper electrode 322 includes a ground port G. The lower electrode 311 includes an output port E.

The MR elements 10A and 10B and the bias field generation units 20A and 20B are configured and arranged in the same manner as the fourth embodiment. The MR element 10A and the MR element 10B are connected in series via the lower electrode 311. The MR element 10A corresponds to the first magnetoresistive element of the present invention. The MR element 10B corresponds to the second magnetoresistive element of the present invention. The bias field generation unit 20A corresponds to the first bias field generation unit of the present invention. The bias field generation unit 20B corresponds to the second bias field generation unit of the present invention. Thus, the magnetic sensor 301 includes one set of the first magnetoresistive element, the second magnetoresistive element, the first bias field generation unit and the second bias field generation unit.

The magnetization pinned layer 13, the nonmagnetic layer 14, and the free layer 15 of the MR element 10A correspond to the first magnetization pinned layer, the first nonmagnetic layer, and the first free layer of the present invention, respectively. The magnetization pinned layer 13, the nonmagnetic layer 14, and the free layer 15 of the MR element 10B correspond to the second magnetization pinned layer, the second nonmagnetic layer, and the second free layer of the present invention, respectively. The magnets 21A and 22A correspond to the at least one first magnet of the present invention. The magnets 21B and 22B correspond to the at least one second magnet of the present invention.

As shown in FIG. 20, one end of the MR element 10A is connected to the power supply port V. The other end of the MR element 10A is connected to the output port E. One end of the MR element 10B is connected to the output port E. The other end of the MR element 10B is connected to the ground port G. The MR elements 10A and 10B constitute a half-bridge circuit.

A power supply voltage of a predetermined magnitude is applied to the power supply port V. The ground port G is grounded. Each of the MR elements 10A and 10B varies in resistance depending on the X-direction component Hx of the external magnetic field. The resistance of the MR element 10B varies 180° out of phase with the resistance of the MR element 10A. The output port E outputs a signal corresponding to the potential at the connection point between the MR elements 10A and 10B. The signal varies depending on the X-direction component Hx of the external magnetic field. The signal outputted from the output port E of the magnetic sensor 301 is twice as sensitive as the output signal of the magnetic sensor 1 corresponding to the resistance of one MR element 10 of the first embodiment.

The bias field generation unit 20A generates a bias magnetic field HAb the same as that in the fourth embodiment, and the bias field generation unit 20B generates a bias magnetic field HBb the same as that in the fourth embodiment. Thus, the fifth embodiment provides the magnetic sensor 301 of a half-bridge circuit configuration which produces an output signal of inherently high sensitivity, and achieves a further enhanced sensitivity of the output signal of the magnetic sensor 301 by reducing the effects of the interlayer coupling magnetic fields HAin and HBin. Further, the fifth embodiment makes it possible to magnetize the magnets 21A, 22A, 21B and 22B simultaneously by using magnetic fields oriented in the same direction. Thus, the fifth embodiment facilitates the manufacture of the magnetic sensor 301 which produces an output signal of high sensitivity as described above.

In the fifth embodiment, the end faces of the magnets 21A and 22A facing the MR element 10A and the end faces of the magnets 21B and 22B facing the MR element 10B may be perpendicular to the Z direction. Further, the magnetic sensor 301 may include a plurality of sets of the MR element 10A and the bias field generation unit 20A and a plurality of sets of the MR element 10B and the bias field generation unit 20B. In such a case, MR elements 10A in the plurality of sets are connected in series to form a first string of MR elements, and the MR elements 10B in the plurality of sets are connected in series to form a second string of MR elements. Then, the first and second strings of MR elements constitute a half-bridge circuit.

The remainder of configuration, function and effects of the fifth embodiment are similar to those of the fourth embodiment.

The present invention is not limited to the foregoing embodiments, and various modifications may be made thereto. For example, in the first to third embodiments, the bias field generation unit 20 may be constituted of a single magnet. In this case also, it is possible to apply the bias magnetic field Hb including the first magnetic field component Hb1 and the second magnetic field component Hb2 to the free layer 15 through the use of the single magnet. Similarly, in the fourth and fifth embodiments, each of the plurality of bias field generation units may be constituted of a single magnet.

Further, the scale is not limited to a linear scale but can be a rotating body, such as a multipole-magnetized magnet having a plurality of pairs of N and S poles alternately arranged in a circumferential direction, or a gear having teeth formed of a magnetic material. In such a case, the first direction is the direction of a tangent to the outer circumference of the rotating body in a cross section perpendicular to the central axis of rotation of the rotating body.

Further, each MR element may be formed by stacking the underlayer 11, the free layer 15, the nonmagnetic layer 14, the magnetization pinned layer 13, the antiferromagnetic layer 12, and the protective layer 16 in this order from the bottom.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A magnetic sensor configured to detect a component in a first direction of an external magnetic field, comprising a magnetoresistive element and a bias field generation unit, wherein the magnetoresistive element includes a magnetization pinned layer having a magnetization pinned in a direction parallel to the first direction, a free layer having a magnetization that varies depending on the component in the first direction of the external magnetic field, and a nonmagnetic layer interposed between the magnetization pinned layer and the free layer, the magnetization pinned layer, the nonmagnetic layer and the free layer are stacked to be adjacent in a second direction orthogonal to the first direction, the free layer receives an interlayer coupling magnetic field in the direction parallel to the first direction resulting from the magnetization pinned layer, the bias field generation unit applies a bias magnetic field to the free layer, and the bias magnetic field includes a first magnetic field component in a direction opposite to the direction of the interlayer coupling magnetic field and a second magnetic field component in a third direction orthogonal to the first and second directions.

2. The magnetic sensor according to claim 1, wherein the bias field generation unit includes at least one magnet.

3. The magnetic sensor according to claim 2, wherein the at least one magnet is a pair of magnets arranged with the magnetoresistive element in between.

4. The magnetic sensor according to claim 2, wherein the at least one magnet is spaced from the magnetoresistive element.

5. The magnetic sensor according to claim 2, wherein the magnetoresistive element and the at least one magnet are aligned in a fourth direction inclined with respect to both of the first direction and the third direction.

6. The magnetic sensor according to claim 5, wherein the at least one magnet has a magnetization in a direction parallel to the fourth direction.

7. The magnetic sensor according to claim 5, wherein the at least one magnet has a magnetization in a direction parallel to the third direction.

8. A magnetic sensor system comprising:
the magnetic sensor according to claim 1; and
a scale whose relative position with respect to the magnetic sensor is variable in the first direction,
wherein a change in the relative position of the scale with respect to the magnetic sensor causes a change in the component in the first direction of the external magnetic field.

9. A magnetic sensor configured to detect a component in a first direction of an external magnetic field, comprising at least one set of a first magnetoresistive element, a second magnetoresistive element, a first bias field generation unit and a second bias field generation unit, wherein
the first magnetoresistive element and the second magnetoresistive element are connected in series,
the first magnetoresistive element includes a first magnetization pinned layer having a magnetization pinned in a direction parallel to the first direction, a first free layer having a magnetization that varies depending on the component in the first direction of the external magnetic field, and a first nonmagnetic layer interposed between the first magnetization pinned layer and the first free layer,
the first magnetization pinned layer, the first nonmagnetic layer and the first free layer are stacked to be adjacent in a second direction orthogonal to the first direction,
the first free layer receives a first interlayer coupling magnetic field in the direction parallel to the first direction resulting from the first magnetization pinned layer,
the first bias field generation unit applies a first bias magnetic field to the first free layer,
the first bias magnetic field includes a first magnetic field component in a direction opposite to the direction of the first interlayer coupling magnetic field and a second magnetic field component in a third direction orthogonal to the first and second directions,
the second magnetoresistive element includes a second magnetization pinned layer having a magnetization pinned in a fifth direction opposite to the direction of the magnetization of the first magnetization pinned layer, a second free layer having a magnetization that varies depending on the component in the first direction of the external magnetic field, and a second nonmagnetic layer interposed between the second magnetization pinned layer and the second free layer,
the second magnetization pinned layer, the second nonmagnetic layer and the second free layer are stacked to be adjacent in the second direction,
the second free layer receives a second interlayer coupling magnetic field resulting from the second magnetization pinned layer, the second interlayer coupling magnetic field being in a direction opposite to the direction of the first interlayer coupling magnetic field,
the second bias field generation unit applies a second bias magnetic field to the second free layer, and
the second bias magnetic field includes a third magnetic field component in a direction opposite to the direction of the second interlayer coupling magnetic field and a fourth magnetic field component in the third direction.

10. The magnetic sensor according to claim 9, wherein
the first bias field generation unit includes at least one first magnet,
the first magnetoresistive element and the at least one first magnet are aligned in a sixth direction inclined with respect to both of the first direction and the third direction,
the second bias field generation unit includes at least one second magnet,
the second magnetoresistive element and the at least one second magnet are aligned in a seventh direction inclined with respect to both of the first direction and the third direction,
the sixth direction and the seventh direction are inclined in mutually opposite directions with respect to the third direction, and
the at least one first magnet and the at least one second magnet have magnetizations in the same direction parallel to the third direction.

11. The magnetic sensor according to claim 9, wherein
the at least one set of the first magnetoresistive element, the second magnetoresistive element, the first bias field generation unit and the second bias field generation unit is two sets of the first magnetoresistive element, the second magnetoresistive element, the first bias field generation unit and the second bias field generation unit, and
the first and second magnetoresistive elements in the two sets constitute a Wheatstone bridge circuit.

12. A magnetic sensor system comprising:
the magnetic sensor according to claim 9; and
a scale whose relative position with respect to the magnetic sensor is variable in the first direction,
wherein a change in the relative position of the scale with respect to the magnetic sensor causes a change in the component in the first direction of the external magnetic field.

* * * * *